(12) United States Patent
Lee et al.

(10) Patent No.: US 12,433,105 B2
(45) Date of Patent: Sep. 30, 2025

(54) DISPLAY DEVICE

(71) Applicant: Samsung Display Co., Ltd., Yongin-Si (KR)

(72) Inventors: Yeonhwa Lee, Hwaseong-si (KR); Hye Jin Gwark, Suwon-si (KR); Arong Kim, Hwaseong-si (KR); Jaeik Kim, Seoul (KR); Jungsun Park, Yongin-si (KR); Heemin Park, Hwaseong-si (KR); Joongu Lee, Seoul (KR); Hyoung Sub Lee, Yongin-si (KR); Kyu Hwan Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 683 days.

(21) Appl. No.: 17/734,380

(22) Filed: May 2, 2022

(65) Prior Publication Data

US 2023/0039703 A1    Feb. 9, 2023

(30) Foreign Application Priority Data

Aug. 6, 2021    (KR) .......................... 10-2021-0104124

(51) Int. Cl.
*H10K 59/122*    (2023.01)
*H10K 50/844*    (2023.01)
(Continued)

(52) U.S. Cl.
CPC ......... *H10K 59/122* (2023.02); *H10K 50/844* (2023.02); *H10K 59/123* (2023.02);
(Continued)

(58) Field of Classification Search
CPC .. H10K 59/122; H10K 50/844; H10K 59/123; H10K 59/124; H10K 2102/102;
(Continued)

(56) References Cited

U.S. PATENT DOCUMENTS 7,750,561 B2    7/2010    Aziz et al.
9,853,067 B2 *    12/2017    Cai ........................ H10D 86/60
(Continued)

FOREIGN PATENT DOCUMENTS

KR          101429933 B1    8/2014
KR    10-2020-0088822 A    7/2020
(Continued)

*Primary Examiner* — Caleb E Henry
(74) *Attorney, Agent, or Firm* — Innovation Counsel LLP

(57) ABSTRACT

Disclosed is a display device including a base layer, a circuit layer including a plurality of transistors spaced apart from each other and disposed on a top of the base layer, a plurality of insulating layers disposed on a top of the base layer, and a plurality of contact electrodes electrically connected to the transistors, respectively, a first light emitting unit disposed on a top of the circuit layer, a second light emitting unit, and a lower protrusion disposed between at least one of the transistors and the second lower electrode, wherein at least one of the contact electrodes is disposed to extend to a top surface of the lower protrusion in the circuit layer while following a shape of the lower protrusion to simplify an etching process of an encapsulation layer.

20 Claims, 9 Drawing Sheets

(51) Int. Cl.
*H10K 59/123* (2023.01)
*H10K 59/124* (2023.01)
*H10K 102/10* (2023.01)

(52) U.S. Cl.
CPC ..... *H10K 59/124* (2023.02); *H10K 2102/102* (2023.02); *H10K 2102/103* (2023.02)

(58) Field of Classification Search
CPC ............ H10K 2102/103; H10K 59/873; H01L 27/3262; H01L 27/1214; H01L 27/3276; H01L 51/56; H01L 27/1225; H01L 27/124; H01L 29/41733; H01L 29/42384; H01L 27/3248; H01L 21/02063; H01L 27/1251; H01L 27/3258; H01L 29/78606; H01L 29/78618; H01L 29/7869
See application file for complete search history.

(56) References Cited

U.S. PATENT DOCUMENTS

| | | | |
|---|---|---|---|
| 10,483,339 B2 * | 11/2019 | Moon | H10K 59/123 |
| 10,886,327 B2 | 1/2021 | Chae et al. | |
| 10,991,784 B2 * | 4/2021 | Kwon | H10K 59/1213 |
| 11,114,499 B2 | 9/2021 | Lee et al. | |
| 11,262,967 B2 | 3/2022 | Ye et al. | |
| 2005/0275038 A1 * | 12/2005 | Shih | H10D 30/6755 257/382 |
| 2013/0270527 A1 * | 10/2013 | Kwon | H10D 30/6755 254/43 |
| 2014/0183528 A1 * | 7/2014 | Endo | H10D 86/481 257/43 |
| 2017/0278977 A1 * | 9/2017 | Jeong | H10D 86/441 |
| 2017/0294498 A1 * | 10/2017 | Kwon | H10D 30/6729 |
| 2018/0061922 A1 * | 3/2018 | Kim | H10K 71/00 |
| 2019/0198565 A1 | 6/2019 | Lee et al. | |
| 2020/0258966 A1 * | 8/2020 | Cha | H10D 86/423 |
| 2020/0395422 A1 * | 12/2020 | Xu | H10K 59/352 |
| 2022/0302233 A1 * | 9/2022 | Liu | H10K 59/124 |
| 2022/0328582 A1 * | 10/2022 | Lee | H10K 50/818 |

FOREIGN PATENT DOCUMENTS

| | | |
|---|---|---|
| KR | 10-2020-0091408 A | 7/2020 |
| KR | 10-2020-0096529 A | 8/2020 |
| KR | 20210054122 A | 5/2021 |

* cited by examiner

DISPLAY DEVICE

CROSS-REFERENCE TO RELATED APPLICATIONS

This application claims priority under 35 U.S.C. § 119 to Korean Patent Application No. 10-2021-0104124 filed on Aug. 6, 2021, in the Korean Intellectual Property Office, the disclosures of which are incorporated by reference herein in their entireties.

BACKGROUND

1. Field of Disclosure

Embodiments of the present disclosure described herein relate to a display device, and more particularly, to a display device including a plurality of stacked light emitting units and a lower protrusion.

2. Description of the Related Art

Display devices of various forms are used to provide image information. When manufacturing the display device, a display device including each pixel providing each of red, green, and blue light for realizing the image information is used.

To realize the image information of high-resolution on the display device, a display device including a plurality of light emitting units stacked in a thickness direction may be used to increase the number and areas of light emitting regions of the pixels respectively providing red, green, and blue light. In one example, research for efficiently manufacturing the display device including the plurality of light emitting units stacked in the thickness direction is being conducted.

SUMMARY

Embodiments of the present disclosure provide a display device that may simplify an etching process of an encapsulation layer.

According to an embodiment, a display device includes a base layer, a circuit layer including a plurality of transistors spaced apart from each other and disposed on a top of the base layer, a plurality of insulating layers disposed on a top of the base layer, and a plurality of contact electrodes electrically connected to the plurality of transistors, respectively, a first light emitting unit including a first lower electrode disposed on top of the circuit layer, a first pixel defining layer disposed on top of the first lower electrode, wherein a first pixel opening for exposing the first lower electrode is defined in the first pixel defining layer, a first light emitting layer disposed on top of the first lower electrode, a first upper electrode disposed on top of the first light emitting layer, and a first encapsulation layer disposed on top of the first upper electrode, a second light emitting unit including a second lower electrode disposed on top of the first light emitting unit, a second pixel defining layer disposed on top of the second lower electrode, wherein a second pixel opening for exposing the second lower electrode is defined in the second pixel defining layer, a second light emitting layer disposed on top of the second lower electrode, a second upper electrode disposed on top of the second light emitting layer, and a second encapsulation layer disposed on top of the second upper electrode, and a lower protrusion disposed between at least one of the transistors and the second lower electrode, and at least one of the contact electrodes is disposed to extend to a top surface of the lower protrusion in the circuit layer while following a shape of the lower protrusion.

The transistors may include a first transistor electrically connected to the first light emitting unit, and a second transistor spaced apart from the first transistor and electrically connected to the second light emitting unit, and the contact electrodes may further include a first upper contact electrode for electrically connecting the first transistor and the first light emitting unit, and a second upper contact electrode for electrically connecting the second transistor to the second light emitting unit.

The second upper contact electrode may be disposed to extend to the top surface of the lower protrusion in the circuit layer while following the shape of the lower protrusion, and the second upper contact electrode may be electrically connected to the second lower electrode in a portion, which overlaps the lower protrusion.

The first encapsulation layer may include a first inorganic layer, a first organic layer, and a second inorganic layer, which are sequentially stacked in a thickness direction, and a length extending from a bottom surface of the first inorganic layer to a top surface of the lower protrusion may be greater than a length extending from the bottom surface of the first inorganic layer to a top surface of the first organic layer.

The first encapsulation layer may be divided into a first portion where the second inorganic layer is directly disposed on the first inorganic layer, and a second portion where the first organic layer is disposed between the first inorganic layer and the second inorganic layer, and the first portion may be more closely disposed to the lower protrusion than the second portion.

The lower protrusion may contain a polyimide-based resin, an acrylic-based resin, or a novolak-type phenol-based resin.

The lower protrusion may contain at least one of silicon oxide and silicon nitride.

The insulating layers may include a lower insulating layer disposed adjacent the transistors, and an upper insulating layer disposed on top of the lower insulating layer, wherein an insulating contact hole for exposing the lower insulating layer is defined in the upper insulating layer, and the lower protrusion may be disposed between the lower insulating layer and the second lower electrode in the insulating contact hole.

The lower protrusion may be disposed directly on the top of the lower insulating layer in the insulating contact hole.

The lower protrusion may be disposed on a top of the first pixel defining layer.

An area on a plane of the first encapsulation layer may be smaller than an area on a plane of the second encapsulation layer.

A third pixel opening may be defined in the first pixel defining layer and is spaced apart from the first pixel opening, the display device may further include a third light emitting unit disposed on a top of the circuit layer in the third pixel opening, and the third light emitting unit may include a third lower electrode disposed on a top of the circuit layer and exposed by the third pixel opening, a third light emitting layer disposed on a top of the third lower electrode, a third upper electrode disposed on a top of the third light emitting layer, and the second encapsulation layer disposed on a top of the third upper electrode.

The lower protrusion may be disposed between the first light emitting unit and the third light emitting unit on a plane.

The display device may further include a third light emitting unit disposed on a top of the second light emitting unit, wherein the third light emitting unit includes a third lower electrode, a third pixel defining layer disposed on a top of the third lower electrode, wherein a third pixel opening for exposing the third lower electrode is defined in the third pixel defining layer, a third light emitting layer disposed on a top of the third lower electrode, a third upper electrode disposed on a top of the third light emitting layer, and a third encapsulation layer disposed on a top of the third upper electrode.

The display device may further include an upper protrusion disposed on a plane to be spaced apart from the lower protrusion, and disposed between at least one of the transistors and the third lower electrode. The second encapsulation layer may include a third inorganic layer, a second organic layer, and a fourth inorganic layer sequentially stacked in a thickness direction, and a length extending from a bottom surface of the third inorganic layer to a top surface of the upper protrusion may be greater than a length extending from the bottom surface of the third inorganic layer to a top surface of the second organic layer.

The transistors may include a first transistor electrically connected to the first light emitting unit, a second transistor spaced apart from the first transistor and electrically connected to the second light emitting unit, and a third transistor spaced apart from the second transistor and electrically connected to the third light emitting unit, and the circuit layer may further include a first upper contact electrode for electrically connecting the first transistor to the first light emitting unit to each other, a second upper contact electrode for electrically connecting the second transistor to the second light emitting unit, and a third upper contact electrode for electrically connecting the third transistor to the third light emitting unit.

The third upper contact electrode may be disposed from the third transistor to a top surface of the upper protrusion while following a shape of the upper protrusion, and the third upper contact electrode may be electrically connected to the third lower electrode in a portion where the third upper contact electrode overlaps the upper protrusion.

The display device may further include a metal oxide film disposed between the at least one transistor and the lower protrusion.

The metal oxide film may contain at least one of indium-zinc-oxide (IZO), indium-tin-oxide (ITO), zinc-oxide (ZnO), indium-gallium-zinc-oxide (IGZO), and aluminum-zinc-oxide (AZO).

BRIEF DESCRIPTION OF THE DRAWINGS

The above and other objects and features of the present disclosure will become apparent by describing in detail embodiments thereof with reference to the accompanying drawings.

DETAILED DESCRIPTION

Figure 1:
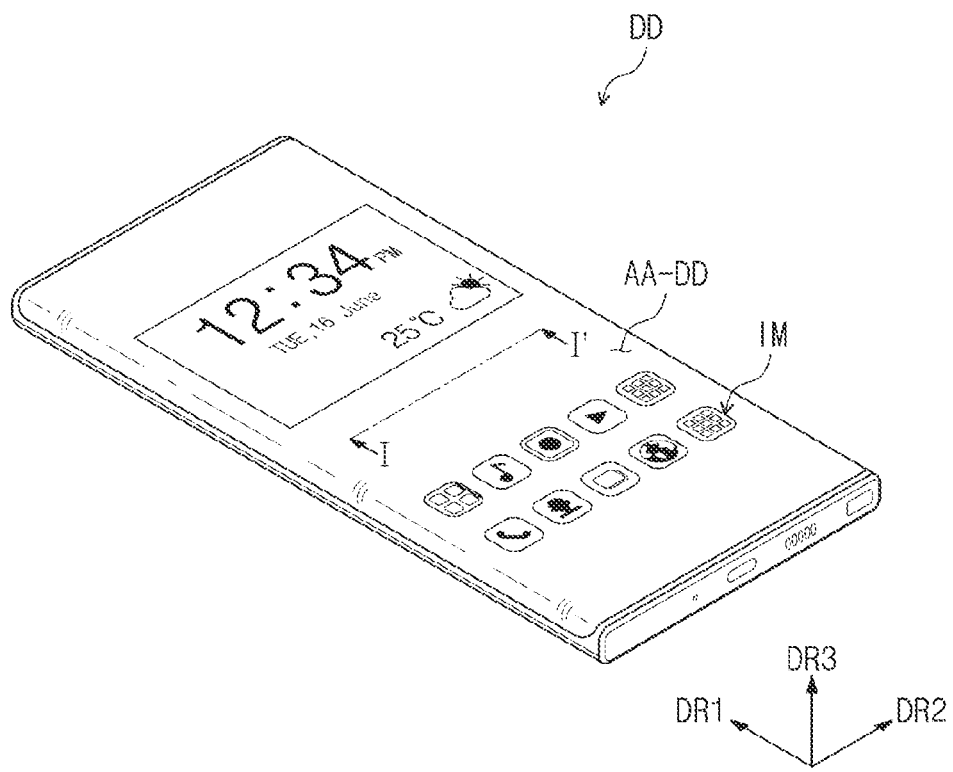
FIG. 1 is a perspective view of a display device according to an embodiment.

The present disclosure may make various changes and may have various forms. Thus, specific embodiments will be illustrated in the drawings and will be described in detail in the text. However, this is not intended to limit the present disclosure to a particular form of disclosure, and it should be understood to include all changes, equivalents, or substitutes included in the spirit and scope of the present disclosure.

In the present specification, when a component (or a region, a layer, a portion, and the like) is referred to as being "on", "connected to", or "coupled to" another component, it means that the component may be directly disposed/connected/coupled on another component or a third component may be disposed between the component and another component.

In one example, in the present application, "directly disposed" may mean that there is no layer, film, region, plate, and the like added between a portion and another portion of a layer, a film, a region, a plate, and the like. For example, "directly disposed" may mean disposing without using an additional member such as an adhesive member or the like between two layers or two members.

Like reference numerals refer to like components. In addition, in the drawings, thicknesses, ratios, and dimensions of components are exaggerated for effective description of technical content. "and/or" includes all of one or more combinations that the associated components may define.

Terms such as first, second, and the like may be used to describe various components, but the components should not be limited by the terms. The above terms are used only for the purpose of distinguishing one component from another. For example, without departing from the scope of the present disclosure, a first component may be named as a second component, and similarly, the second component may also be named as the first component. The singular expression includes the plural expression unless the context clearly dictates otherwise.

In addition, terms such as "beneath", "below", "on", "above" are used to describe the relationship of the components shown in the drawings. The above terms are relative concepts, and are described with reference to directions indicated in the drawings. In the present specification, "disposed on" may refer to a case of being disposed not only on top of, but also beneath one member.

It should be understood that terms such as "include" or "have" are intended to specify that a feature, a number, a step, an operation, a component, a part, or a combination thereof described in the specification is present, and do not preclude a possibility of addition or existence of one or more other features or numbers, steps, operations, components, parts, or combinations thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment will be described with reference to the drawings.

Figure 2:
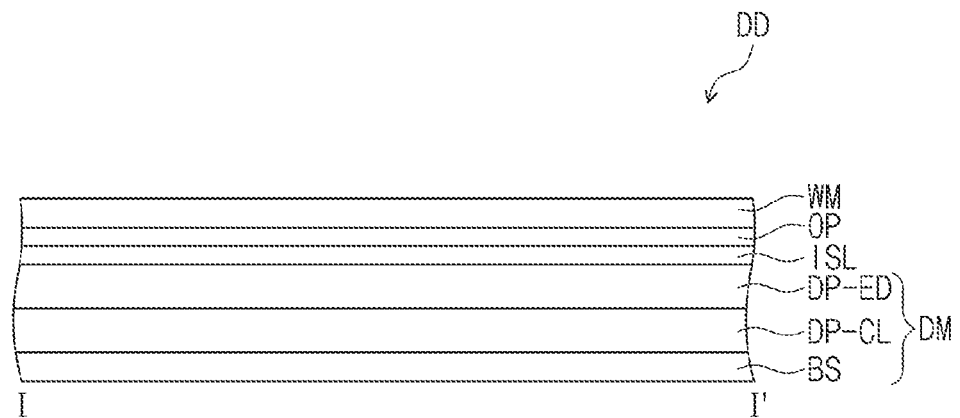
FIG. 2 is a cross-sectional view of a display device according to an embodiment.
Figure 3:
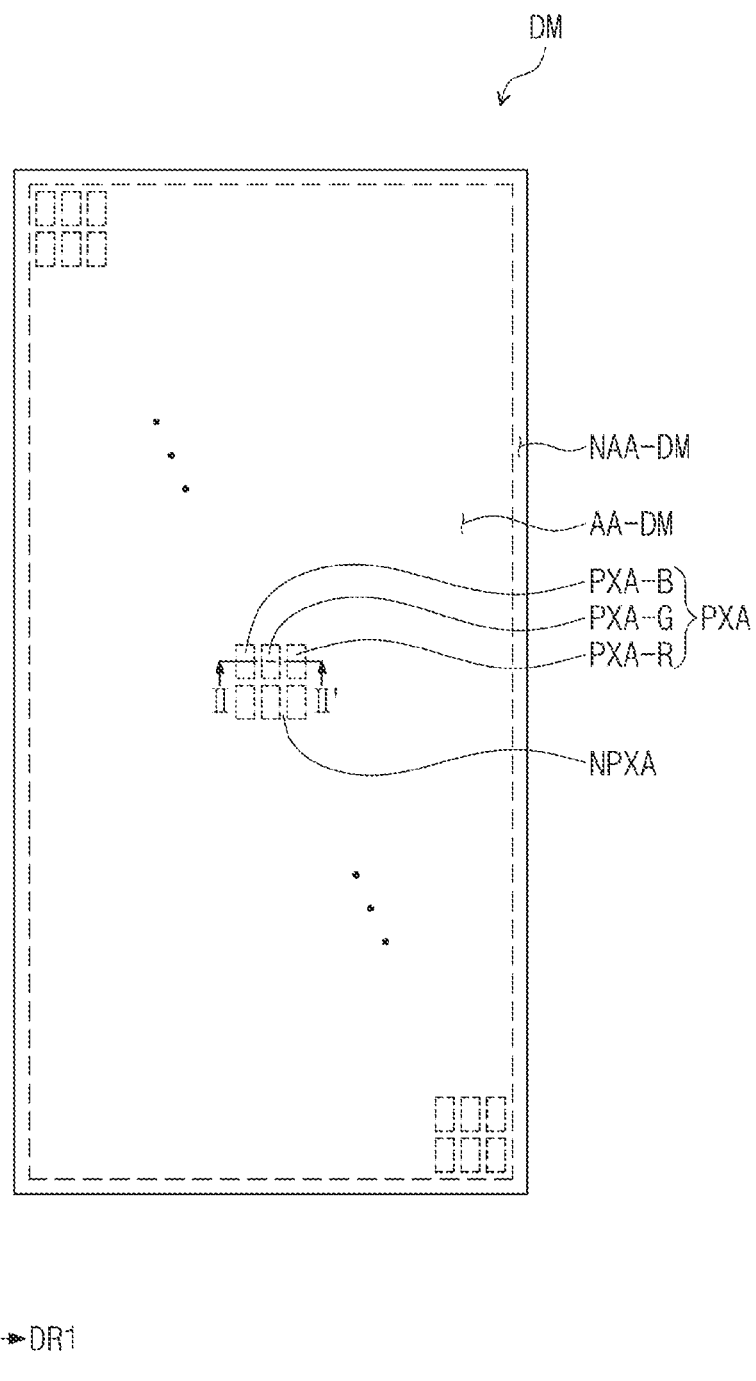
FIG. 3 is a plan view of a display module according to an embodiment.
Figure 4:
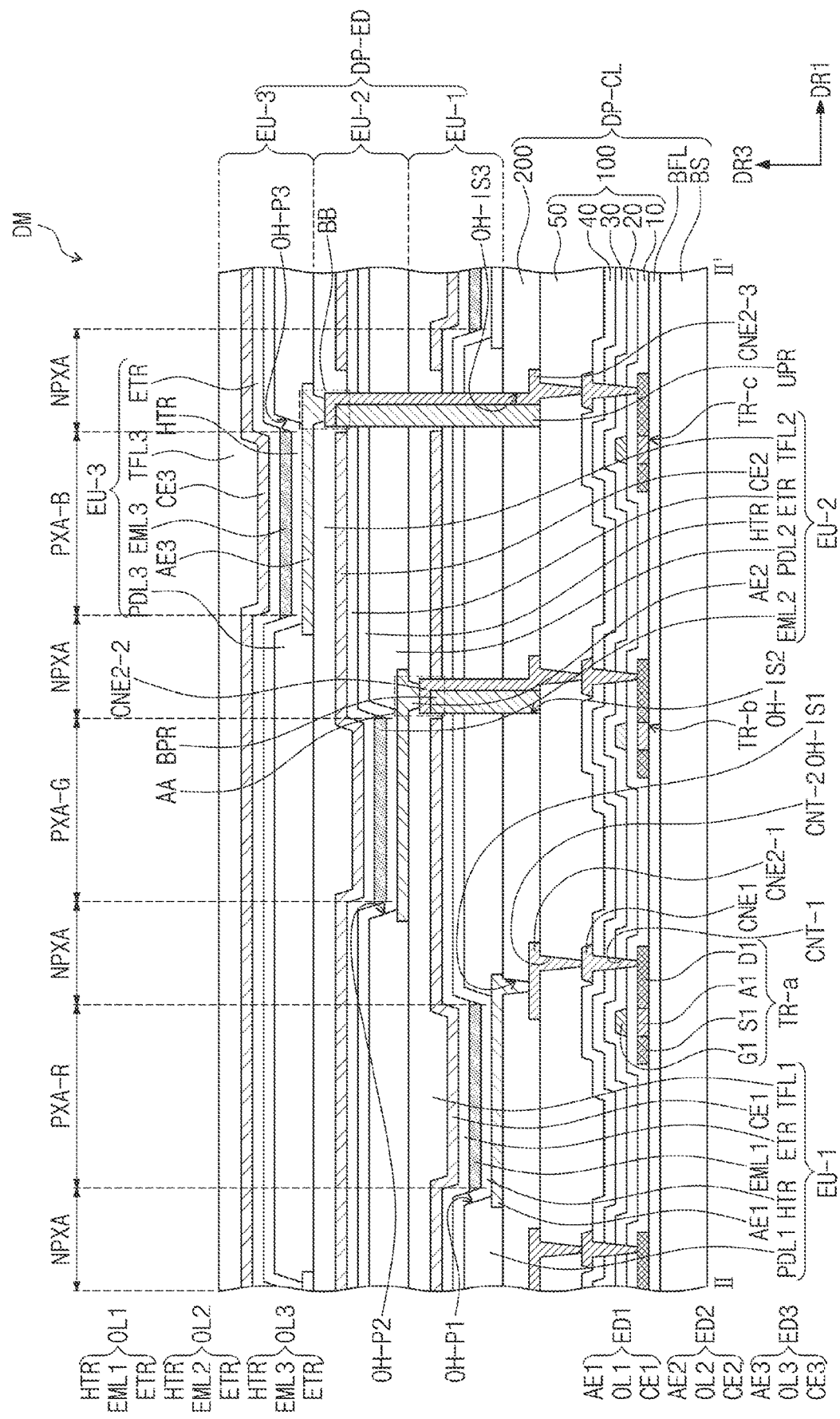
FIG. 4 is a cross-sectional view of a display module according to an embodiment.

FIG. 1 is a perspective view of a display device according to an embodiment. FIG. 2 is a cross-sectional view of a display device according to an embodiment. FIG. 2 is a cross-sectional view corresponding to a line I-I' in FIG. 1. FIG. 3 is a plan view of a display module according to an embodiment. FIG. 4 is a cross-sectional view of a display module according to an embodiment. FIG. 4 shows a cross-section corresponding to a line II-II' in FIG. 3.

A display device DD according to an embodiment may be a device activated in response to an electrical signal. For example, the display device DD may be a mobile phone, a tablet, a vehicle navigation device, a game console, or a wearable device, but may not be limited thereto. FIG. 1 shows that the display device DD is the mobile phone.

The display device DD may display an image IM through an active region AA-DD. The active region AA-DD may include a plane defined by a first directional axis DR1 and a second directional axis DR2. The active region AA-DD may further include a curved surface bent from at least one side of the plane defined by the first directional axis DR1 and the second directional axis DR2. The display device DD according to one embodiment shown in FIG. 1 is illustrated as including two curved surfaces respectively bent from both side surfaces of the plane defined by the first directional axis DR1 and the second directional axis DR2. However, a shape of the active region AA-DD is not limited thereto. For example, the active region AA-DD may include only the plane, or the active region AA-DD may further include at least two, for example, four curved surfaces respectively bent from four side surfaces of the plane.

In one example, FIG. 1 and following drawings show the first directional axis DR1 to a third directional axis DR3. Directions indicated by the first to third directional axes DR1, DR2, and DR3 described herein are relative concepts and are able to be converted into other directions. In addition, the directions indicated by the first to third directional axes DR1, DR2, and DR3 may be described as first to third directions, and the same reference numerals may be used.

In the present specification, the first directional axis DR1 and the second directional axis DR2 may be orthogonal to each other, and the third directional axis DR3 may be a direction normal to the plane defined by the first directional axis DR1 and the second directional axis DR2.

The display device DD according to one embodiment may include a display module DM, an optical layer OP disposed on top of the display module DM, and a window WM. In addition, the display device DD according to one embodiment may include a sensor layer ISL disposed on top of the display module DM. The display module DM may include a base layer BS, a circuit layer DP-CL disposed on top of the base layer BS, and a display element layer DP-ED disposed on top of the circuit layer DP-CL.

The base layer BS may be a member that provides a base surface on which the display element layer DP-ED is disposed. The base layer BS may be a glass substrate, a metal substrate, a polymer substrate, or the like. However, the embodiment is not limited thereto, and the base layer BS may be an inorganic layer, a functional layer, or a composite material layer.

The base layer BS may have a multi-layer structure. For example, the base layer BS may have a three-layer structure of a polymer resin layer, an adhesive layer, and a polymer resin layer. In particular, the polymer resin layer may contain a polyimide-based resin. In addition, the polymer resin layer may include at least one of an acryl-based resin, a methacryl-based resin, a polyisoprene-based resin, a vinyl-based resin, an epoxy-based resin, an urethane-based resin, a cellulose-based resin, a siloxane-based resin, a polyamide-based resin, a novolac-type phenol-based resin, and a perylene-based resin. In one example, in the present specification, the "xx-based" resin means a resin containing a functional group of "xx".

The circuit layer DP-CL may be disposed on top of the base layer BS. The circuit layer DP-CL may include an insulating layer, a semiconductor pattern, a conductive pattern, a signal line, and the like. The insulating layer, a semiconductor layer, and a conductive layer may be formed on top of the base layer BS by coating, deposition, or the like, and then, the insulating layer, the semiconductor layer, and the conductive layer may be selectively patterned through a plurality of photolithography processes. Thereafter, the semiconductor pattern, the conductive pattern, and the signal line included in the circuit layer DP-CL may be formed. The circuit layer DP-CL may be electrically connected to light emitting units EU-1, EU-2, and EU-3 to be described later. For example, lower electrodes AE1, AE2, and AE3, upper electrodes CE1, CE2, and CE3, and the like of the light emitting units EU-1, EU-2, and EU-3 may be electrically connected to the circuit layer DP-CL through contact holes defined in the light emitting units EU-1, EU-2, and EU-3.

The display element layer DP-ED may be disposed on top of the circuit layer DP-CL. The display element layer DP-ED may include light emitting devices ED1, ED2, and ED3. The display element layer DP-ED may include the plurality of light emitting units EU-1, EU-2, and EU-3 respectively including the light emitting devices ED1, ED2, and ED3. In one example, the display element layer DP-ED may include an organic light emitting device, a quantum dot light emitting device, or the like as the light emitting devices ED1, ED2, and ED3.

The sensor layer ISL may be disposed on the display element layer DP-ED. The sensor layer ISL may sense an external input applied from the outside. The external input may be an input of a user. The input of the user may include various types of external inputs, such as a body part of the user, light, a heat, a pen, a pressure, or the like.

The sensor layer ISL may be formed on the display element layer DP-ED through a continuous process. In this case, it may be expressed that the sensor layer ISL is directly disposed on the display element layer DP-ED. "Being directly disposed" may mean that a third component is not disposed between the sensor layer ISL and the display element layer DP-ED. That is, a separate adhesive member may not be disposed between the sensor layer ISL and the display element layer DP-ED. In one example, the embodiment may not be limited thereto, and the adhesive member (not shown) may be further disposed between the sensor layer ISL and the display element layer DP-ED.

The optical layer OP may be disposed on top of the sensor layer ISL. The optical layer OP may include at least one of optical functional layers, such as an optical path control layer that changes an optical path, an anti-reflection layer that reduces reflectivity of external light incident from the outside, or the like. For example, in the display device (DD) of one embodiment, the optical layer OP may be a polarizing plate or a color filter layer.

The window WM may be disposed on top of the optical layer OP. The window WM may correspond to the uppermost layer of the display device DD. The window WM may be a tempered glass substrate. The window WM may have a reinforced surface to stably protect the sensor layer ISL and the display module DM from external impact. The window WM according to one embodiment may further include a printed layer (not shown) disposed at an inner or outer edge. For example, the printed layer (not shown) may be a portion provided corresponding to a peripheral region NAA-DM. An adhesive member (not shown) may be further disposed between the window WM and the optical layer OP. The adhesive member (not shown) may include an optically clear adhesive layer.

The display module DM may include an active region AA-DM and the peripheral region NAA-DM adjacent to a periphery of the active region AA-DM. That is, the peripheral region NAA-DM may surround the active region AA-DM. The active region AA-DM may be a region activated in response to the electrical signal. In the peripheral region NAA-DM, a driving circuit or a driving wiring for driving the active region AA-DM, various signal lines or pads that provide the electrical signal to the active region AA-DM, electronic elements, or the like may be placed.

The display device DD according to one embodiment may comprise the display module DM including a plurality of light emitting regions PXA. The light emitting regions PXA may be spaced apart from each other without overlapping each other when viewed on a plane. In the present specification, "when viewed on a plane" or "on a plane" refers to when viewed in the direction of the third directional axis DR3. For example, referring to FIG. 3, light emitting regions PXA-R, PXA-G, and PXA-B may be spaced apart from each other when viewed on the plane defined by the first directional axis DR1 and the second directional axis DR2. Spaces between the light emitting regions PXA may correspond to a non-light emitting region NPXA.

Referring to FIGS. 3 and 4, the light emitting regions PXA may include the first light emitting region PXA-R, the second light emitting region PXA-G, and the third light emitting region PXA-B respectively corresponding to the light emitting units EU-1, EU-2, and EU-3. Each of the first to third light emitting regions PXA-R, PXA-G, and PXA-B may be a region to which light generated from each of the light emitting units EU-1, EU-2, and EU-3 is emitted. The first to third light emitting regions PXA-R, PXA-G, and PXA-B may be regions corresponding to pixel openings OH-P1, OH-P2, and OH-P3 in the light emitting units EU-1, EU-2, and EU-3, respectively.

The first to third light emitting regions PXA-R, PXA-G, and PXA-B may be spaced apart from each other without overlapping each other when viewed on the plane. For example, the non-light emitting region NPXA may be disposed between neighboring two of the light emitting regions PXA-R, PXA-G, and PXA-B.

The display device DD of one embodiment may include the plurality of light emitting units stacked in a thickness direction to exhibit a characteristic that, compared to a conventional display device, an area of the non-light emitting region NPXA or a width of the non-light emitting region disposed between the light emitting regions is reduced.

The first to third light emitting regions PXA-R, PXA-G, and PXA-B may not overlap each other. In one example, although not shown, within a range in which the neighboring two of the first to third light emitting regions PXA-R, PXA-G, and PXA-B do not overlap each other, and the first to third light emitting regions PXA-R, PXA-G, and PXA-B are spaced apart from each other, the area of the non-light emitting region NPXA may be very small compared to an area of the light emitting region. For example, within the range in which the neighboring two of the first to third light emitting regions PXA-R, PXA-G, and PXA-B do not overlap each other and the light emitting regions do not overlap each other, the area of the non-light emitting region between the two neighboring light emitting regions may be very small or the non-light emitting region may be omitted.

The display device DD of one embodiment may include the display module DM including the base layer BS, the circuit layer DP-CL disposed on the base layer BS, and the plurality of light emitting units EU-1, EU-2, and EU-3 disposed on the circuit layer DP-CL. At least one of the plurality of light emitting units EU-1, EU-2, and EU-3 may be disposed on a layer different from that of the remaining light emitting units in the thickness direction. That is, at least one of the plurality of light emitting units EU-1, EU-2, and EU-3 may be disposed on a plane different from that of the remaining light emitting units in the thickness direction. For example, all of the plurality of light emitting units EU-1, EU-2, and EU-3 may be located on different planes in the thickness direction, or one or two selected from the plurality of light emitting units EU-1, EU-2, and EU-3 may be located on one plane, and the remainder may be spaced in the thickness direction apart from and located on a different plane from said one or two.

In one embodiment, the display element layer DP-ED disposed on the circuit layer DP-CL may include the plurality of light emitting units EU-1, EU-2, and EU-3 stacked in the direction of the third directional axis DR3, which is the thickness direction. The plurality of light emitting units EU-1, EU-2, and EU-3 may include the lower electrodes AE1, AE2, and AE3, pixel defining layers PDL1, PDL2, and PDL3, functional layers OL1, OL2, and OL3, the upper electrodes CE1, CE2, and CE3, and encapsulation layers TFL1, TFL2, and TFL3, respectively.

Referring to FIG. 4, the display element layer DP-ED of the display module DM according to an embodiment may include the first to third light emitting units EU-1, EU-2, and EU-3. In one embodiment, the display element layer DP-ED may include the first light emitting unit EU-1, the second light emitting unit EU-2 disposed on top of the first light emitting unit EU-1, and the third light emitting unit EU-3 disposed on top of the second light emitting unit EU-2. In addition, in one embodiment, the second functional layer OL2 of the second light emitting unit EU-2 may be disposed on top of the first functional layer OL1 of the first light emitting unit EU-1, and the third functional layer OL3 of the third light emitting unit EU-3 may be disposed on top of the second functional layer OL2 of the second light emitting unit EU-2.

The light emitting units EU-1, EU-2, and EU-3 may include the light emitting devices ED1, ED2, and ED3 including the lower electrodes AE1, AE2, and AE3, the functional layers OL1, OL2, and OL3, and the upper electrodes CE1, CE2, and CE3, respectively. In the embodiment shown in FIG. 4, the functional layers OL1, OL2, and OL3 of the light emitting devices ED1, ED2, and ED3 may be located on different layers. The light emitting devices ED1, ED2, and ED3 may emit light of different wavelength regions.

Each of the functional layers OL1, OL2, and OL3 includes a hole transport region HTR, each of light emitting layers EML1, EML2, and EML3, and an electron transport region ETR. Each of the light emitting layers EML1, EML2, and EML3 may emit the light of the different wavelength regions, respectively. For example, in the display module DM according to one embodiment shown in FIG. 4, the first emission layer EML1 may emit red light, the second emission layer EML2 may emit green light, and the third emission layer EML3 may emit blue light. However, the embodiment is not limited to thereto. The wavelength regions of the light respectively emitted from the first to third light-emitting layers EML1, EML2, and EML3 may be a combination of light other than red light, the green light, and the blue light.

In addition, a stacking order of the light emitting units EU-1, EU-2, and EU-3 that emit the light of the different wavelength regions may be different from that shown in FIG. 4. For example, the light emitting unit that emits the green light may be disposed at the bottom, and the light emitting units that emit the red light and the blue light may be disposed on the top thereof. Alternatively, the light emitting unit that emits the blue light may be disposed at the bottom, and the light emitting units that emit the red light and the green light may be disposed on the top thereof.

In one example, although not shown, a light absorbing layer or a light blocking layer may be further disposed between an upper light emitting unit and a lower light emitting unit to correspond to a light emitting region of the upper light emitting unit to minimize influence of light emitted from the lower light emitting unit on the upper light emitting unit. For example, when a light emitting unit that emits light of a relatively short wavelength region is disposed below, the light absorbing layer or the light blocking layer may be further disposed beneath the upper light emitting unit to correspond to a pixel opening of the upper light emitting unit to prevent a case in which the upper light emitting unit is excited and emits light by the light of the short wavelength region with high energy.

Figure 5:
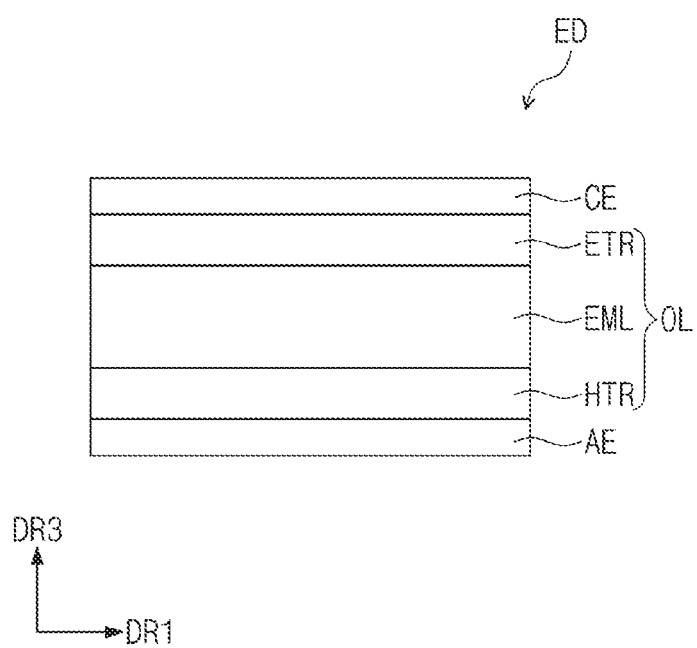
FIG. 5 is a cross-sectional view showing a light emitting device according to an embodiment.

FIG. 5 shows one embodiment of a light emitting device. The light emitting device ED shown in FIG. 5 is representative of the light emitting devices ED1, ED2, and ED3 respectively included in the light emitting units EU-1, EU-2, and EU-3 shown in FIG. 4. There may be a difference in a configuration of a light emitting layer EML of the light emitting device ED in the different light emitting units EU-1, EU-2, and EU-3.

The light emitting device ED may include a lower electrode AE and an upper electrode CE facing each other, and may include a functional layer OL that is disposed between the lower electrode AE and the upper electrode CE and includes the light emitting layer EML. The functional layer OL may include the hole transport region HTR disposed between the light emitting layer EML and the lower electrode AE, and the electron transport region ETR disposed between the light emitting layer EML and the upper electrode CE.

The functional layer OL such as the hole transport region HTR, the light emitting layer EML, and the electron transport region ETR may be provided as a single layer or a plurality of layers. In addition, the functional layer OL may be formed using a vacuum deposition method or the like. However, the embodiment may not be limited thereto, and the functional layer OL may be formed using various methods such as a spin coating method, a casting method, a Langmuir-Blodgett (LB) method, an inkjet printing method, a laser printing method, a laser induced thermal imaging (LITI) method, and the like.

The lower electrode AE may be an anode or a cathode. In addition, the lower electrode AE may be a pixel electrode. The lower electrode AE may be a transmissive electrode, a semi-transmissive electrode, or a reflective electrode. When the lower electrode AE is the transmissive electrode, the lower electrode AE may contain a transparent metal oxide, for example, indium tin oxide (ITO), indium zinc oxide (IZO), zinc oxide (ZnO), indium tin zinc oxide (ITZO), and the like. When the lower electrode AE is the semi-transmissive electrode or the reflective electrode, the lower electrode AE may contain Ag, Mg, Cu, Al, Pt, Pd, Au, Ni, Nd, Ir, Cr, Li, Ca, LiF/Ca, LiF/Al, Mo, Ti, W, or a compound or a mixture thereof (e.g., a mixture of Ag and Mg). Alternatively, the lower electrode AE may be of a multi-layer structure including a reflective film or a semi-transmissive film made of the above material, and a transparent conductive film made of indium tin oxide (ITO), indium zinc oxide (IZO), zinc oxide (ZnO), indium tin zinc oxide (ITZO), and the like. For example, the lower electrode AE may have a three-layer structure of ITO/Ag/ITO, but may not be limited thereto.

The hole transport region HTR may be disposed between the lower electrode AE and the light emitting layer EML. The hole transport region HTR may include at least one of a hole injection layer, a hole transport layer, and an electron blocking layer.

The hole transport region HTR may contain a phthalocyanine compound such as copper phthalocyanine, DNTPD ($N^1,N^{1'}$-([1,1'-biphenyl]-4,4'-diyl)bis($N^1$-phenyl-$N^4,N^4$-di-m-tolylbenzene-1,4-diamine)), m-MTDATA(4,4',4"-[tris(3-methylphenyl)phenylamino]triphenylamine), TDATA(4,4'4"-Tris(N,N-diphenylamino)triphenyl amine), 2-TNATA (4,4',4"-tris[N(2-naphthyl)-N-phenylamino]-triphenylamine), PEDOT/PSS(Poly(3,4-ethylenedioxythiophene)/Poly(4-styrenesulfonate)), PANI/DB SA(Polyaniline/Dodecylbenzenesulfonic acid), PANI/CSA(Polyaniline/Camphor sulfonic acid), PANI/PSS (Polyaniline/Poly(4-styrenesulfonate)), NPB (N,N'-di(naphthalene-1-yl)-N,N'-diphenyl-benzidine), polyether ketone (TPAPEK) containing triphenylamine, 4-Isopropyl-4'-methyldiphenyliodonium [Tetrakis(pentafluorophenyl)borate], HATCN(dipyrazino [2,3-f: 2',3'-h]quinoxaline-2,3,6,7,10,11-hexacarbonitrile), and the like.

The hole transport region HTR may contain a carbazole-based derivative such as N-phenylcarbazole, polyvinylcarbazole, and the like, a fluorene-based derivative, a triphenylamine-based derivative such as TPD(N,N'-bis(3-methylphenyl)-N,N'-diphenyl-[1,1'-biphenyl]-4,4'-diamine), TCTA(4,4',4"-tris(N-carbazolyl)triphenylamine), and the like, NPB(N,N'-di(naphthalene-1-yl)-N,N'-diphenyl-benzidine), TAPC(4,4'-Cyclohexylidene bis [N,N-bis(4-methylphenyl)benzenamine]), HMTPD (4,4'-Bis[N,N'-(3-tolyeamino]-3,3'-dimethylbiphenyl), mCP(1,3-Bis(N-carbazolyl)benzene), and the like.

The light emitting layer EML is disposed on the hole transport region HTR. The light emitting layer EML may have a single layer made of a single material, a single layer made of a plurality of different materials, or a multi-layer structure having a plurality of layers made of a plurality of different materials.

The light emitting layer EML may contain a fluorescent or phosphorescent material that emits the red light, the green light, or the blue light. In the light emitting device according to one embodiment, the light emitting layer EML may contain an anthracene derivative, a pyrene derivative, a fluoranthene derivative, a chrysene derivative, a dihydrobenzanthracene derivative, or a triphenylene derivative. In addition, the light emitting layer EML may contain quantum dots as the light emitting material.

The electron transport region ETR may be disposed between the light emitting layer EML and the upper electrode CE. The electron transport region ETR may include at least one of an electron injection layer, an electron transport layer, and a hole blocking layer.

The electron transport region ETR may contain, for example, $Alq_3$(tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, TPBi(1,3,5-Tri(1-phenyl-1H-benzo[d]imidazol-2-yl)benzene), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), $Bebq_2$(berylliumbis(benzoquinolin-10-olate)), ADN(9,10-di(naphthalene-2-yl)anthracene), BmPyPhB(1,3-Bis[3,5-di(pyridin-3-yl)phenyl]benzene), and a compound thereof.

In addition, the electron transport region ETR may contain metal halide such as LiF, NaCl, CsF, RbCl, RbI, CuI, and KI, lanthanide metal such as Yb, and a co-deposition material of the metal halide and the lanthanide metal. For example, the electron transport region ETR may contain KI:Yb, RbI:Yb, and the like as the co-deposition material. In one example, a metal oxide such as $Li_2O$ and BaO, or Liq (8-hydroxyl-Lithium quinolate) may be used for the electron transport region ETR, but the embodiment may not be limited thereto. The electron transport region ETR may also be made of a mixture of an electron transport material and an insulating organo metal salt.

The upper electrode CE is disposed on top of the electron transport region ETR. The upper electrode CE may be a common electrode. The upper electrode CE may be the cathode or the anode, but the embodiment may not be limited thereto. For example, when the lower electrode AE is the anode, the upper electrode CE may be the cathode, and when the lower electrode AE is the cathode, the upper electrode CE may be the anode.

The upper electrode CE may be the transmissive electrode, the semi-transmissive electrode, or the reflective electrode. When the upper electrode CE is the transmissive electrode, the upper electrode CE may contain the transparent metal oxide, for example, indium tin oxide (ITO), indium zinc oxide (IZO), zinc oxide (ZnO), indium tin zinc oxide (ITZO), and the like.

When the upper electrode CE is the semi-transmissive electrode or the reflective electrode, the upper electrode CE may contain Ag, Mg, Cu, Al, Pt, Pd, Au, Ni, Nd, Ir, Cr, Li, Ca, LiF/Ca, LiF/Al, Mo, Ti, W, or the compound or the mixture thereof (e.g., AgMg, AgYb, or MgYb). Alternatively, the upper electrode CE may be of the multi-layer structure including the reflective film or the semi-transmissive film made of the above material, and the transparent conductive film made of indium tin oxide (ITO), indium zinc oxide (IZO), zinc oxide (ZnO), indium tin zinc oxide (ITZO), and the like. For example, the upper electrode CE may contain the aforementioned metal material, a combination of two or more selected from the aforementioned metal materials, oxides of the aforementioned metal materials, or the like.

By a combination of the materials of the lower electrode AE and the upper electrode CE, the light emitting device ED may have a front surface light emitting structure of emitting light in a direction of the upper electrode CE or a rear surface light emitting structure of emitting light in a direction of the lower electrode AE.

In one embodiment shown in FIG. 4 and the like, the first lower electrode AE1, the second lower electrode AE2, and the third lower electrode AE3 may be the reflective electrodes, and the first upper electrode CE1, the second upper electrode CE2, and the third upper electrode CE3 may be the transparent electrodes. In this case, the light emitting devices ED1, ED2, and ED3 may have the front surface light emitting structure.

Alternatively, in one embodiment, the first lower electrode AE1, the second lower electrode AE2, and the third lower electrode AE3 may be the transparent electrodes, and the first upper electrode CE1, the second upper electrode CE2, and the third upper electrode CE3 may be the reflective electrodes. In this case, the light emitting devices ED1, ED2, and ED3 may have the rear surface light emitting structure.

However, the embodiment may not be limited thereto, and materials of the first lower electrode AE1, the second lower electrode AE2, and the third lower electrode AE3 and materials of the first upper electrode CE1, the second upper electrode CE2, and the third upper electrode CE3 may be variously combined.

Referring back to FIG. 4, each of the first light emitting unit to the third light emitting unit EU-1, EU-2, and EU-3 may include the pixel defining layers PDL1, PDL2, and PDL3 in which the pixel openings OH-P1, OH-P2, and OH-P3 that expose the lower electrodes AE1, AE2, and AE3 are defined, respectively. Each of the pixel openings OH-P1, OH-P2, and OH-P3 of the first light emitting unit to the third light emitting unit EU-1, EU-2, and EU-3 may not overlap each other.

In the display device according to one embodiment, the pixel defining layers PDL1, PDL2, and PDL3 may be inorganic layers including at least one of silicon oxide and silicon nitride. Alternatively, the pixel defining layers PDL1, PDL2, and PDL3 may be organic layers made of a polymer resin. For example, the pixel defining layers PDL1, PDL2, and PDL3 may be formed to contain a polyacrylate-based resin or a polyimide-based resin. In addition, the pixel defining layers PDL1, PDL2, and PDL3 may be formed to contain both the polymer resin and an inorganic material.

In one example, the pixel defining layers PDL1, PDL2, and PDL3 may be formed to contain a light absorbing material or may be formed to contain a black pigment or a black dye. The pixel defining layers PDL1, PDL2, and PDL3 formed to contain the black pigment or the black dye may implement a black pixel defining layer. When forming the pixel defining layers PDL1, PDL2, and PDL3, carbon black or the like may be used as the black pigment or the black dye, but the embodiment is not limited thereto.

In one embodiment, the first pixel defining layer PDL1, the second pixel defining layer PDL2, and the third pixel defining layer PDL3 may all contain at least one of silicon oxide and silicon nitride. Further, in one embodiment, pixel defining layers of the remaining light emitting units except for a pixel defining layer included in the light emitting unit disposed at the bottom may contain at least one of silicon oxide and silicon nitride.

For example, in one embodiment shown in FIG. 4, both the second pixel defining layer PDL2 and the third pixel defining layer PDL3 may contain at least one of silicon oxide and silicon nitride, and the first pixel defining layer PDL1 may be an inorganic layer containing at least one of silicon oxide and silicon nitride or an organic layer including the polymer resin. In one embodiment, when the pixel defining layers PDL1, PDL2, and PDL3 are the inorganic layers containing at least one of silicon oxide and silicon nitride, even when high-temperature heat is provided in a subsequent process, it is possible to prevent damage to the functional layers respectively disposed underneath the pixel defining layers.

In one example, each of the pixel defining layers PDL1, PDL2, and PDL3 shown in the present specification is shown as one layer, but the embodiment is not limited thereto. Each of the pixel defining layers PDL1, PDL2, and PDL3 may be provided as a plurality of layers. In addition, at least one of the pixel defining layers PDL1, PDL2, and PDL3, which are formed as the plurality of layers, may be the inorganic layer.

The first light emitting unit EU-1 may include the first lower electrode AE1 patterned on the circuit layer DP-CL, the first pixel defining layer PDL1 in which the first pixel opening OH-P1 exposing a top surface of the first lower electrode AE1 is defined, the first functional layer OL1 disposed on top of the first lower electrode AE1, and the first upper electrode CE1 disposed on top of the first functional layer OLE In addition, the first light emitting unit EU-1 may include a first encapsulation layer TFL1 disposed on top of the first upper electrode CE1.

In one embodiment, the hole transport region HTR and an electron transport region ETR1 of the first functional layer OL1 may be disposed overlapping the first pixel defining layer PDL1 and disposed on the top of the exposed first lower electrode AE1. That is, in one embodiment, the hole transport region HTR and the electron transport region ETR1 of the first functional layer OL1 may not be limited to be disposed in the first light emitting region PXA-R, but may be extended up to and disposed in the second light emitting region PXA-G and the third light emitting region PXA-B. In one embodiment, the hole transport region HTR and the electron transport region ETR1 of the first functional layer OL1 may be provided as a common layer. In addition, in one embodiment, the first upper electrode CE1 may be provided to overlap the entire hole transport region HTR and electron transport region ETR1 of the first functional layer OL1. The first upper electrode CE1 may be provided as the common layer. In one example, the hole transport region HTR, the electron transport region ETR1, the first upper electrode CE1, and the like of the first functional layer OL1 provided as the common layer may be provided in a process using an open mask.

In one example, unlike the embodiment shown in FIG. 4, the hole transport region HTR and the electron transport region ETR1 of the first functional layer OL1 may be provided by being patterned without extending to the second light emitting region PXA-G and the third light emitting region PXA-B. For example, the hole transport region HTR and the electron transport region ETR1 of the first functional layer OL1 may be provided by being patterned using a fine metal mask (FMM) in order not to overlap with the second light emitting region PXA-G and the third light emitting region PXA-B. In addition, the hole transport region HTR and the electron transport region ETR1 of the first functional layer OL1, or the first upper electrode CE1 may be provided using a metal self-patterning (MSP) method of patterning by coating a material with low surface energy on a portion to be patterned such that the hole transport region HTR and the electron transport region ETR1 of the first functional layer OL1, or the first upper electrode CE1 is not provided on the portion to be patterned.

The second light emitting unit EU-2 may include the second lower electrode AE2 patterned on the first light emitting unit EU-1, the second pixel defining layer PDL2 in which the second pixel opening OH-P2 exposing a top surface of the second lower electrode AE2 is defined, the second functional layer OL2 disposed on top of the second lower electrode AE2, and the second upper electrode CE2 disposed on top of the second functional layer OL2. In addition, the second light emitting unit EU-2 may include the second encapsulation layer TFL2 disposed on top of the second upper electrode CE2.In one example, the second lower electrode AE2 of the second light emitting unit EU-2 may be disposed on top of the first encapsulation layer TFL1.

In one embodiment, a hole transport region HTR2 and an electron transport region ETR2 of the second functional layer OL2 may be disposed overlapping the second pixel defining layer PDL2 and disposed on the top of the exposed second lower electrode AE2. That is, in one embodiment, the hole transport region HTR2 and the electron transport region ETR2 of the second functional layer OL2 may not be limited to be disposed in the second light emitting region PXA-G, but may be extended up to and disposed in the first light emitting region PXA-R and the third light emitting region PXA-B. In addition, the hole transport region HTR2 and the electron transport region ETR2 of the second functional layer OL2 may be provided by being patterned without extending to the first light emitting region PXA-R and the third light emitting region PXA-B. As in the above description of the first light emitting unit EU-1, the hole transport region HTR2 and the electron transport region ETR2 of the second functional layer OL2 may be provided as the common layer or provided by being patterned.

The third light emitting unit EU-3 may include the third lower electrode AE3 patterned on the second light emitting unit EU-2, the third pixel defining layer PDL3 in which the third pixel opening OH-P3 exposing a top surface of the third lower electrode AE3 is defined, the third functional layer OL3 disposed on top of the third lower electrode AE3, and the third upper electrode CE3 disposed on top of the third functional layer OL3. In addition, the third light emitting unit EU-3 may include the third encapsulation layer TFL3 disposed on top of the third upper electrode CE3. In one example, the third lower electrode AE3 of the third light emitting unit EU-3 may be disposed on the top of the second encapsulation layer TFL2.

In one embodiment, a hole transport region HTR3 and an electron transport region ETR3 of the third functional layer OL3 may be disposed overlapping the third pixel defining layer PDL3 as well as on top of the exposed third lower electrode AE3. That is, in one embodiment, the hole transport region HTR3 and the electron transport region ETR3 of the third functional layer OL3 may not be limited to be disposed in the third light emitting region PXA-B, but may be extended up to and disposed in the first light emitting region PXA-R and the second light emitting region PXA-G. In one embodiment, the hole transport region HTR3 and the electron transport region ETR3 of the third functional layer OL3 may be provided as the common layer using the open mask.

Each of the first to third pixel openings OH-P1, OH-P2, and OH-P3 of each of the first light emitting unit to the third light emitting unit EU-1, EU-2, and EU-3 may correspond to each of the first light emitting region to the third light emitting regions PXA-R, PXA-G, and PXA-B. The first to third pixel openings OH-P1, OH-P2, and OH-P3 may not overlap each other.

Figure 6:
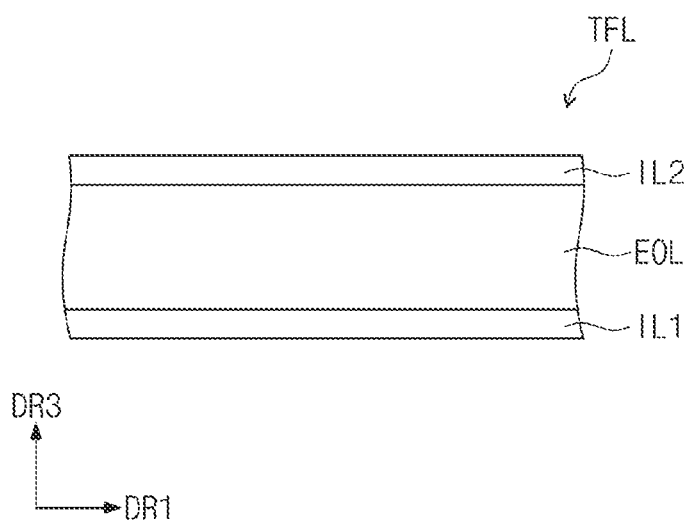
FIG. 6 is a cross-sectional view showing an encapsulation layer according to an embodiment.

Referring to FIG. 4, each of the light emitting units EU-1, EU-2, and EU-3 may include each of the encapsulation layers TFL1, TFL2, and TFL3 that covers each of the light emitting devices ED1, ED2, and ED3. FIG. 6 shows an embodiment of the encapsulation layer. The encapsulation layer TFL shown in FIG. 6 is representative of the encapsulation layers TFL1, TFL2, and TFL3 respectively included in the light emitting units EU-1, EU-2, and EU-3 shown in FIG. 4.

The encapsulation layer TFL may include at least one inorganic layer IL1 or IL2. The encapsulation layer TFL may include at least one inorganic layer IL1 or IL2 and at least one organic layer EOL, and each of the inorganic layers IL1 and IL2 and the organic layer EOL may be alternately disposed. For example, the encapsulation layer TFL may include the two inorganic layers IL1 and IL2 and the organic layer EOL disposed therebetween. The encapsulation layer TFL may include the two inorganic layers IL1 and IL2 and the organic layer EOL which is disposed therebetween in order to have moisture resistance.

The inorganic layers IL1 and IL2 may contain at least one of a silicon nitride and a silicon oxide such as silicon nitride, silicon oxide, silicon oxynitride, and the like. The organic layer EOL may be made from the acryl-based resin, the urethane-based resin, an imide-based resin, and the like.

In one example, the encapsulation layer TFL according to one embodiment shown in FIG. 6 is shown as three layers of the first inorganic layer ILL the organic layer EOL, and the second inorganic layer IL2 are stacked, but the embodiment is not limited thereto. The encapsulation layer TFL may include a plurality of inorganic layers and a plurality of organic layers, and each of the plurality of inorganic layers and each of the plurality of organic layers may be alternately disposed.

Referring back to FIG. 4, in one embodiment, the circuit layer DP-CL may include first to third transistors TR-a, TR-b, and TR-c disposed to be spaced apart from each other. In addition, the circuit layer DP-CL may include a buffer layer BFL and a plurality of insulating layers 100 and 200. In addition, the circuit layer DP-CL may include contact electrodes CNE1, CNE2-1, CNE2-2, and CNE2-3 that electrically connect the lower electrodes AE1, AE2, and AE3 and the transistors TR-a, TR-b, and TR-c to each other. The contact electrodes CNE1, CNE2-1, CNE2-2, and CNE2-3 may include the lower contact electrode CNE1 and the upper contact electrodes CNE2-1, CNE2-2, and CNE2-3.

The buffer layer BFL may improve a bonding force between the base layer BS and the semiconductor pattern. The buffer layer BFL may contain at least one of a silicon oxide layer, a silicon nitride layer, and a silicon oxynitride layer. For example, in the buffer layer BFL, two or more layers selected from the silicon oxide layer, the silicon nitride layer, and the silicon oxynitride layer may be alternately stacked.

The transistors TR-a, TR-b, and TR-c may be disposed on the buffer layer BFL. Each of the transistors TR-a, TR-b, and TR-c may include a source S1, an active A1, and a drain D1. The source region S1, the active A1, and the drain D1 may be formed from the semiconductor pattern. The semiconductor pattern may contain polysilicon. However, the embodiment may not be limited thereto, and the semiconductor pattern may contain amorphous silicon or the metal oxide.

The semiconductor pattern may have different electrical properties depending on whether it is doped or not. The semiconductor pattern may include a first region having high conductivity and a second region having low conductivity. The first region may be doped with an N-type dopant or a P-type dopant. The second region may also be referred to as a channel region. The conductivity of the first region may be greater than that of the second region, and the first region may actually serve as an electrode or a signal line. The second region may substantially correspond to the active (or a channel) of the transistor. In other words, a portion of the semiconductor pattern may be the active of the transistor, another portion thereof may be the source or the drain of the transistor, and the remaining portion thereof may be the contact electrode or a connection signal line. The source S1 and the drain D1 of each of the transistors TR-a, TR-b, and TR-c may extend in opposite directions from the active A1 on a cross-section.

A lower insulating layer 100 may be disposed on the top of the buffer layer BFL. The lower insulating layer 100 may include a first insulating layer 10, a second insulating layer 20, a third insulating layer 30, a fourth insulating layer 40, and a fifth insulating layer 50, which are sequentially stacked in the third directional axis DR3.

The first insulating layer 10 may cover the semiconductor pattern by overlapping the plurality of light emitting units EU-1, EU-2, and EU-3 in common. The first insulating layer 10 may be the inorganic layer and/or the organic layer, and may have the single-layer or the multi-layer structure. The first insulating layer 10 may contain at least one of aluminum oxide, titanium oxide, silicon oxide, silicon nitride, and silicon oxynitride. In the present embodiment, the first insulating layer 10 may be a single-layer silicon oxide layer. The insulating layer of the circuit layer DP-CL to be described later as well as the first insulating layer 10 may be the inorganic layer and/or the organic layer, and may have the single-layer or the multi-layer structure. The inorganic layer may contain at least one of the above-mentioned materials, but may not be limited thereto.

A gate G1 of each of the transistors TR-a, TR-b, and TR-c is disposed on top of the first insulating layer 10. The gate G1 may be a portion of a metal pattern. The gate G1 overlaps the active A1. In a process of doping the semiconductor pattern, the gate G1 may function as a mask.

The second insulating layer 20 may be disposed on top of the first insulating layer 10 and may cover the gate G1. The second insulating layer 20 may overlap pixels in common. The second insulating layer 20 may be the inorganic layer and/or the organic layer, and may have the single-layer or the multi-layer structure including at least one of the silicon oxide layer, the silicon nitride layer, and the silicon oxynitride layer.

The third insulating layer 30 may be disposed on the top of the second insulating layer 20, and may have the single-layer or the multi-layer structure including at least one of the silicon oxide layer, the silicon nitride layer, and the silicon oxynitride layer.

The fourth insulating layer 40 may be disposed on the top of the third insulating layer 30. The fourth insulating layer 40 may have the single-layer or the multi-layer structure including at least one of the silicon oxide layer, the silicon nitride layer, and the silicon oxynitride layer.

The lower contact electrode CNE1 may be disposed on the top of the fourth insulating layer 40. The lower contact electrode CNE1 may be connected to each of the transistors TR-a, TR-b, and TR-c through a contact hole CNT-1 penetrating the first, second, and third insulating layers 10, 20, and 30.

The fifth insulating layer 50 may be disposed on the top of the fourth insulating layer 40. The fifth insulating layer 50 may be the organic layer. The upper contact electrodes CNE2-1, CNE2-2, and CNE2-3 may be disposed on top of the fifth insulating layer 50. The upper contact electrodes CNE2-1, CNE2-2, and CNE2-3 may be spaced apart from each other on a plane. Each of the upper contact electrodes CNE2-1, CNE2-2, and CNE2-3 may be connected to the lower contact electrode CNE1 through a contact hole CNT-2 penetrating the fifth insulating layer 50.

The upper insulating layer 200 may be disposed on the top of the lower insulating layer 100 and may cover the upper contact electrodes CNE2-1, CNE2-2, and CNE2-3. The upper insulating layer 200 may be the organic layer. A plurality of insulating contact holes OH-IS1, OH-IS2, and OH-IS3 may be defined in the upper insulating layer 200. The plurality of insulating contact holes OH-IS1, OH-IS2, and OH-IS3 may be spaced apart from each other on a plane.

Each of the first to third transistors TR-a, TR-b, and TR-c included in the circuit layer DP-CL may be electrically connected to each of the first to third light emitting units EU-1, EU-2, and EU-3 corresponding thereto. The first to third transistors TR-a, TR-b, and TR-c may be independently driven and controlled. A contact electrode CNE included in the circuit layer DP-CL may electrically connect each of the first to third transistors TR-a, TR-b, and TR-c to each of the first to third light emitting units EU-1, EU-2, and EU-3 corresponding thereto.

In one example, the number of insulating layers included in the circuit layer DP-CL, a position of the contact electrode, and the number of contact electrodes, a position of the transistor, and the like may not be limited to those in the embodiment described with reference to FIG. 4, and may be changed based on a design of the circuit layer DP-CL in the display module DM.

The first lower electrode AE1 may be disposed on the top of the upper insulating layer 200. The first lower electrode AE1 may be electrically connected to the first upper contact electrode CNE2-1 through the first insulating contact hole OH-IS1 penetrating the upper insulating layer 200.

The second lower electrode AE2 may be disposed on the top of the first encapsulation layer TFL1. The second lower electrode AE2 may be electrically connected to the second upper contact electrode CNE2-2 through the second insulating contact hole OH-IS2 penetrating the upper insulating layer 200.

The third lower electrode AE3 may be disposed on the top of the second encapsulation layer TFL2. The third lower electrode AE3 may be electrically connected to the third upper contact electrode CNE2-3 through the third insulating contact hole OH-IS3 penetrating the upper insulating layer 200.

The display module DM according to one embodiment may include a lower protrusion BPR disposed on top of the circuit layer DP-CL. The lower protrusion BPR may be disposed on top of the lower insulating layer 100. The lower protrusion BPR may be disposed on top of the fifth insulating layer 50. The lower protrusion BPR may be disposed on top of the lower insulating layer 100 exposed by the second insulating contact hole OH-IS2.

The lower protrusion BPR may be disposed below the second lower electrode AE2. The lower protrusion BPR may be disposed between the circuit layer DP-CL and the second lower electrode AE2. The lower protrusion BPR may be disposed between the lower insulating layer 100 and the second lower electrode AE2 which is disposed inside the second insulating contact hole OH-IS2. The lower protrusion BPR may be disposed between the fifth insulating layer 50 and the second lower electrode AE2 which is disposed inside the second insulating contact hole OH-IS2. The lower protrusion BPR may face the second lower electrode AE2.

The lower protrusion BPR may be directly disposed on the lower insulating layer 100 which is disposed inside the second insulating contact hole OH-IS2. However, this is only an example, and the embodiment is not limited thereto. For example, another component may be disposed between the lower insulating layer 100 and the lower protrusion BPR which is disposed inside the second insulating contact hole OH-IS2.

The lower protrusion BPR may contain the organic material or the inorganic material. Alternatively, the lower protrusion BPR may contain an organic-inorganic composite material. For example, the lower protrusion BPR may contain polyimide as the organic material. The lower protrusion BPR may contain at least one of silicon oxide and silicon nitride as the inorganic material. However, this is only an example, and the embodiment is not limited thereto. For example, the lower protrusion BPR may contain another organic material, another inorganic material, or another organic-inorganic composite material.

The display module DM according to one embodiment may include an upper protrusion UPR disposed on top of the circuit layer DP-CL. The upper protrusion UPR may be disposed on top of the lower insulating layer 100. The upper protrusion UPR may be disposed on top of the fifth insulating layer 50. The upper protrusion UPR may be disposed on top of the lower insulating layer 100 exposed by the third insulating contact hole OH-IS3. In a plan view, the upper protrusion UPR may be spaced apart from the lower protrusion BPR.

The upper protrusion UPR may be disposed below the third lower electrode AE3. The upper protrusion UPR may be disposed between the circuit layer DP-CL and the third lower electrode AE3. The upper protrusion UPR may be disposed between the lower insulating layer 100 and the third lower electrode AE3 which is disposed inside the third insulating contact hole OH-IS3. The upper protrusion UPR may be disposed between the fifth insulating layer 50 and the third lower electrode AE3 inside the third insulating contact hole OH-IS3. The upper protrusion UPR may face the third lower electrode AE3.

The upper protrusion UPR may be directly disposed on the lower insulating layer 100 which is disposed inside the third insulating contact hole OH-IS3. However, this is only an example, and the embodiment is not limited thereto. For example, another component may be disposed between the lower insulating layer 100 and the upper protrusion UPR which is disposed inside the third insulating contact hole OH-IS3.

The upper protrusion UPR may contain the organic material or the inorganic material. Alternatively, the upper protrusion UPR may contain the organic-inorganic composite material. For example, the upper protrusion UPR may contain polyimide as the organic material. The upper protrusion UPR may contain at least one of silicon oxide and silicon nitride as the inorganic material. However, this is only an example, and the embodiment is not limited thereto. For example, the upper protrusion UPR may contain another organic material, another inorganic material, or another organic-inorganic composite material.

Figure 7A:
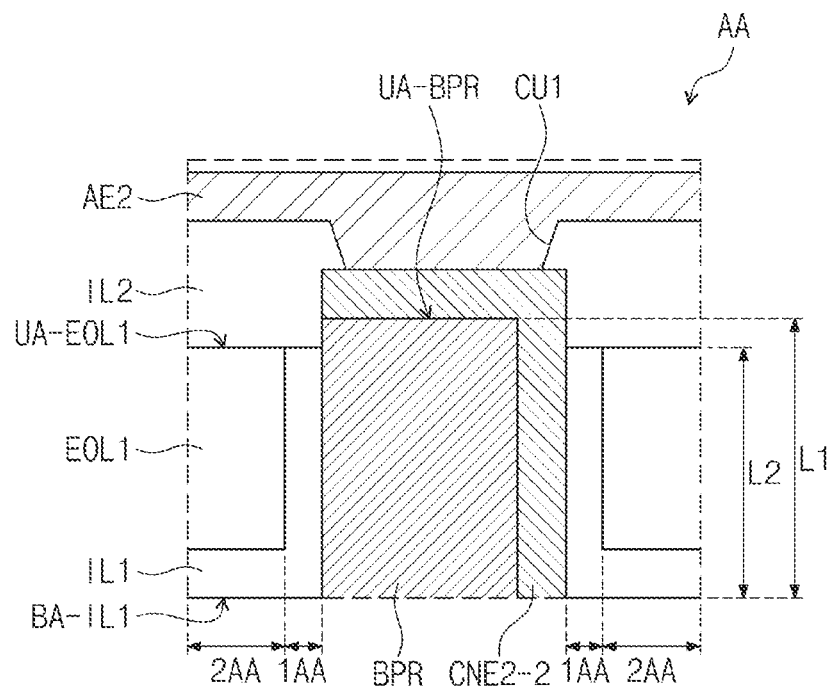
FIG. 7A is an enlarged view of one portion of a display module according to an embodiment.
Figure 7B:
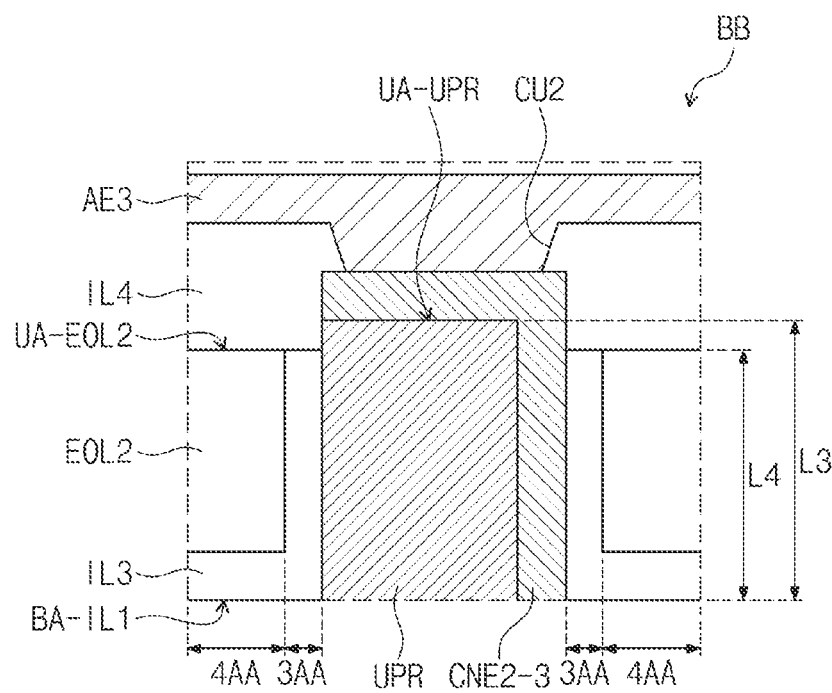
FIG. 7B is an enlarged view of one portion of a display module according to an embodiment.

FIG. 7A is an enlarged view of one portion of a display module according to an embodiment. FIG. 7A is an enlarged view corresponding to a line AA shown in FIG. 4. FIG. 7B is an enlarged view of one portion of a display module according to an embodiment. FIG. 7B is an enlarged view corresponding to a line BB shown in FIG. 4.

Referring to FIG. 7A, in the display module DM according to one embodiment, the first encapsulation layer TFL1 may include the first inorganic layer a first inorganic layer EOL1, and the second inorganic layer IL2, which are sequentially stacked. A first concave portion CU1 recessed in a direction of the first inorganic layer EOL1 may be defined in the second inorganic layer IL2.

A top surface UA-EOL1 of the first inorganic layer EOL1 may be disposed closer to a bottom surface BA-IL1 of the first inorganic layer IL1 than a top surface UA-BPR of the lower protrusion BPR. The top surface UA-BPR of the lower protrusion BPR may be adjacent to the second lower electrode AE2 than the top surface UA-EOL1 of the first inorganic layer EOL1. A length L1 extending from the bottom surface BA-IL1 of the first inorganic layer IL1 to the top surface UA-BPR of the lower protrusion BPR may be larger than a length L2 extending from the bottom surface BA-IL1 of the first inorganic layer IL1 to a top surface UA-OL1 of the first inorganic layer EOL1.

In the display module DM according to one embodiment, the second upper contact electrode CNE2-2 may be disposed to follow a shape of the lower protrusion BPR from the circuit layer DP-CL to the top surface UA-BPR of the lower protrusion BPR. For example, the second upper contact electrode CNE2-2 may be disposed on the top of the lower insulating layer 100 while following the shape of the lower protrusion BPR to the top surface UA-BPR of the lower protrusion BPR.

A portion of the second upper contact electrode CNE2-2 may be disposed between the top surface UA-BPR of the lower protrusion BPR and the second lower electrode AE2. The second upper contact electrode CNE2-2 may be electrically connected to the second lower electrode AE2 at a portion overlapping with the lower protrusion BPR.

The second lower electrode AE2 may be disposed on the top of the second upper contact electrode CNE2-2 in the first concave portion CU1. The first concave portion CU1 may be defined by dry etching the second inorganic layer IL2. The display module DM according to one embodiment may electrically connect the second upper contact electrode CNE2-2 and the second lower electrode AE2 to each other without dry etching the first inorganic layer EOL1, so that an etching process of the first encapsulation layer TFL1 may be simplified.

In the display module DM according to one embodiment, the first encapsulation layer TFL1 may be divided into a first portion 1AA in which the second inorganic layer IL2 is directly disposed on top of the first inorganic layer IL1 and a second portion 2AA in which the first inorganic layer EOL1 is disposed between the first inorganic layer IL1 and the second inorganic layer IL2. In the first portion 1AA, the first inorganic layer IL1 and the second inorganic layer IL2 may be in contact with each other. The first portion 1AA may be disposed adjacent to the lower protrusion BPR than the second portion 2AA. The display module DM according to one embodiment may include the first portion 1AA in which the first inorganic layer IL1 and the second inorganic layer IL2 are in contact with each other to prevent moisture from penetrating into a component disposed below the first encapsulation layer TFL1.

Referring to FIG. 7B, in the display module DM according to one embodiment, the second encapsulation layer TFL2 may include a third inorganic layer IL3, a second organic layer EOL2, and a fourth inorganic layer IL4, which are sequentially stacked. A second concave portion CU2 recessed in a direction of the second organic layer EOL2 may be defined in the fourth inorganic layer IL4.

A top surface UA-EOL2 of the second organic layer EOL2 may be disposed closer to a bottom surface BA-IL3 of the third inorganic layer IL3 than a top surface UA-UPR of the upper protrusion UPR. The top surface UA-UPR of the upper protrusion UPR may be adjacent to the third lower electrode AE3 than the top surface UA-EOL2 of the second organic layer EOL2. A length L3 extending from the bottom surface BA-IL3 of the third inorganic layer IL3 to the top surface UA-UPR of the upper protrusion UPR may be larger than a length L4 extending from the bottom surface BA-IL3 of the third inorganic layer IL3 to the top surface UA-EOL2 of the second inorganic layer EOL2.

In the display module DM according to one embodiment, the third upper contact electrode CNE2-3 may be disposed to follow a shape of the upper protrusion UPR from the circuit layer DP-CL to the top surface UA-UPR of the upper protrusion UPR. For example, the third upper contact electrode CNE2-3 may be disposed on the top of the lower insulating layer 100 while following the shape of the upper protrusion UPR to the top surface UA-UPR of the upper protrusion UPR.

A portion of the third upper contact electrode CNE2-3 may be disposed between the top surface UA-UPR of the upper protrusion UPR and the third lower electrode AE3. The third upper contact electrode CNE2-3 may be electrically connected to the third lower electrode AE3 at a portion overlapping with the upper protrusion UPR.

The third lower electrode AE3 may be disposed on the top of the third upper contact electrode CNE2-3 in the second concave portion CU2. The second concave portion CU2 may be defined by dry etching the fourth inorganic layer IL4. The display module DM according to one embodiment may electrically connect the third upper contact electrode CNE2-3 and the third lower electrode AE3 to each other without dry etching the second organic layer EOL2, so that an etching process of the second encapsulation layer TFL2 may be simplified.

In the display module DM according to one embodiment, the second encapsulation layer TFL2 may be divided into a third portion 3AA in which the fourth inorganic layer IL4 is directly disposed on the top of the third inorganic layer IL3 and a fourth portion 4AA in which the second organic layer EOL2 is disposed between the third inorganic layer IL3 and the fourth inorganic layer IL4. In the third portion 3AA, the third inorganic layer IL3 and the fourth inorganic layer IL4 may be in contact with each other. The third portion 3AA may be disposed adjacent to the upper protrusion UPR than the fourth portion 4AA. The display module DM according to one embodiment may include the third portion 3AA in which the third inorganic layer IL3 and the fourth inorganic layer IL4 are in contact with each other to prevent moisture from penetrating into a component disposed below the second encapsulation layer TFL2.

Figure 8:
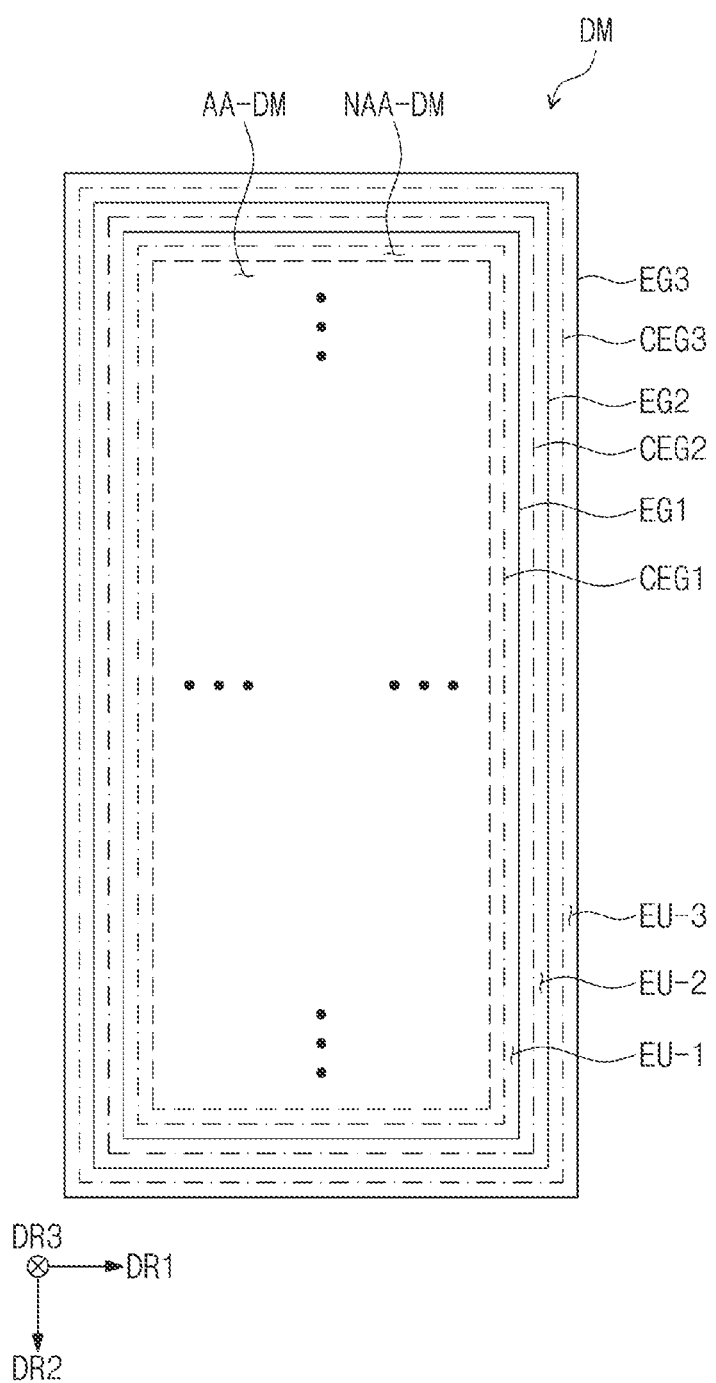
FIG. 8 is a schematic rear view of a display module according to an embodiment.

FIG. 8 is a schematic rear view of a display module according to an embodiment. FIG. 8 is a schematic rear view of the display module omitting the circuit layer DP-CL and the base layer BS, which are components disposed below the first light emitting unit EU-1.

Referring to FIG. 8, in the display module DM according to one embodiment, areas of the first light emitting unit EU-1, the second light emitting unit EU-2, and the third light emitting unit EU-3 may sequentially increase on a plane. The display module DM may be divided into the active region AA-DM in which the first light emitting unit EU-1, the second light emitting unit EU-2, and the third light emitting unit EU-3 all overlap, and the peripheral region NAA-DM in which at least one of the first light emitting unit EU-1, the second light emitting unit EU-2, and the third light emitting unit EU-3 does not overlap.

A driving circuit or a driving wiring for driving the second light emitting unit EU-2, various signal lines or pads providing the electrical signal to the second light emitting unit EU-2, an electronic element, or the like may be disposed in a portion in which the second light emitting unit EU-2 does not overlap the first light emitting unit EU-1. A driving circuit or a driving wiring for driving the third light emitting unit EU-3, various signal lines or pads providing the electrical signal to the third light emitting unit EU-3, an electronic element, or the like may be disposed in a portion in which the third light emitting unit EU-3 does not overlap the second light emitting unit EU-2.

Each of edge portions EG1, EG2, and EG3 of each of the first to third light emitting units EU1, EU2, and EU3 may be an edge portion of each of the first to third encapsulation layers TFE1, TFE2, and TFE3 (as shown in FIG. 4). Areas of the first encapsulation layer TFE1 (as shown in FIG. 4), the second encapsulation layer TFE2 (as shown in FIG. 4), and the third encapsulation layer TFE3 (as shown in FIG. 4) may sequentially increase on a plane. The area on the plane of the second encapsulation layer TFE2 (as shown in FIG. 4) may be larger than the area on the plane of the first encapsulation layer TFE1 (as shown in FIG. 4), and the area of the third encapsulation layer TFE3 (as shown in FIG. 4) may be larger than the area on the plane of the second encapsulation layer TFE2 (as shown in FIG. 4).

Figure 9:
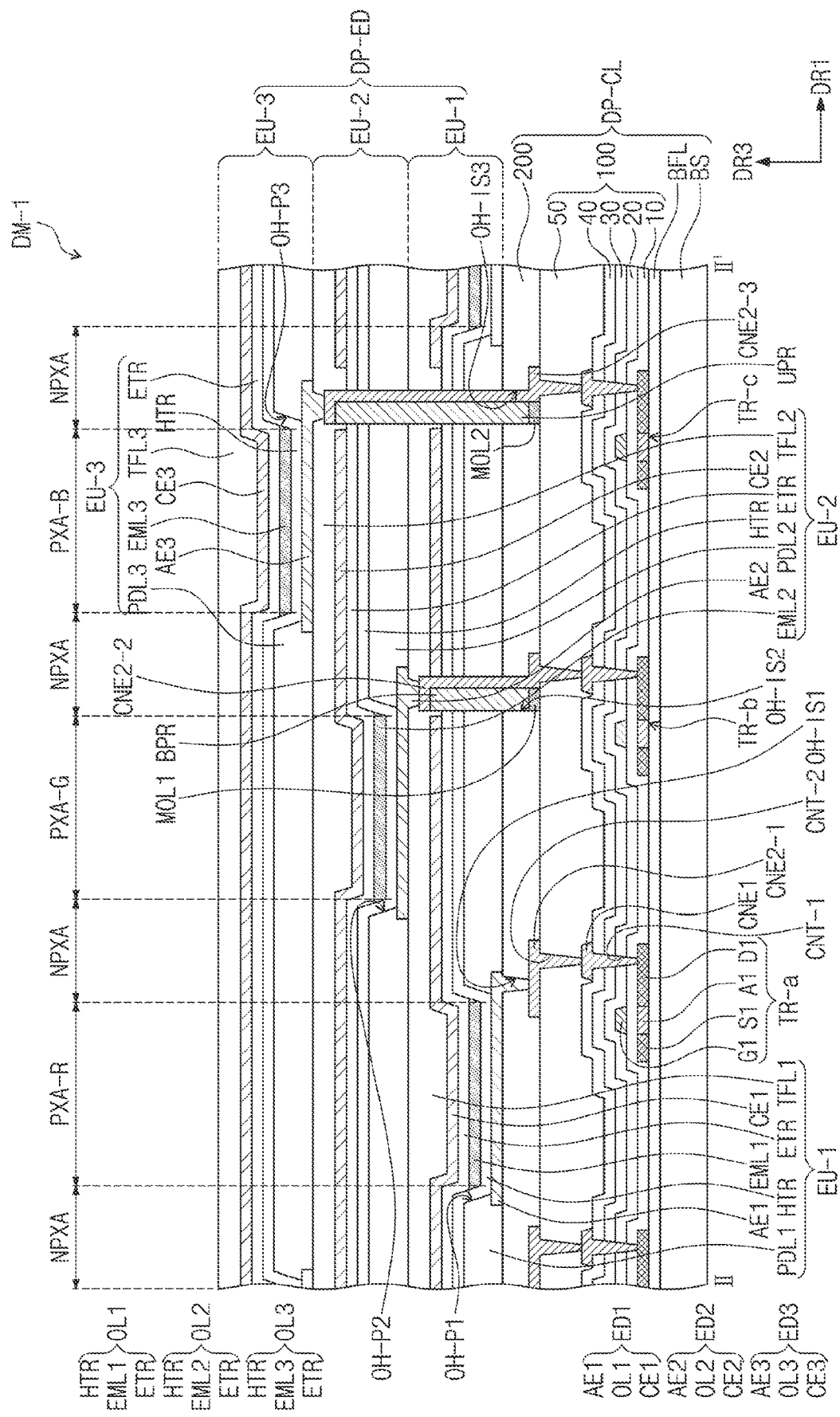
FIG. 9 is a cross-sectional view of a display module according to an embodiment.
Figure 10:
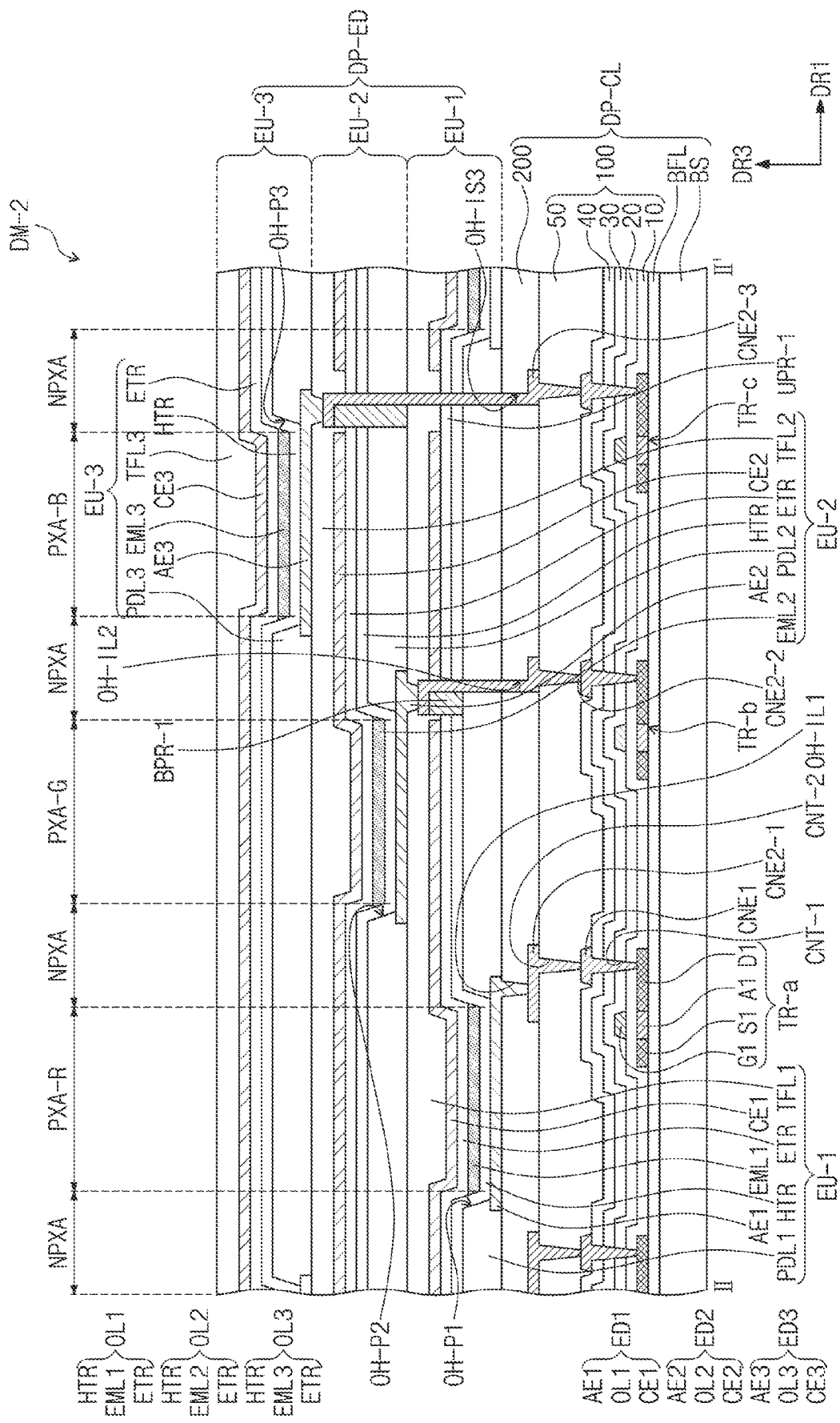
FIG. 10 is a cross-sectional view of a display module according to an embodiment.
Figure 11:
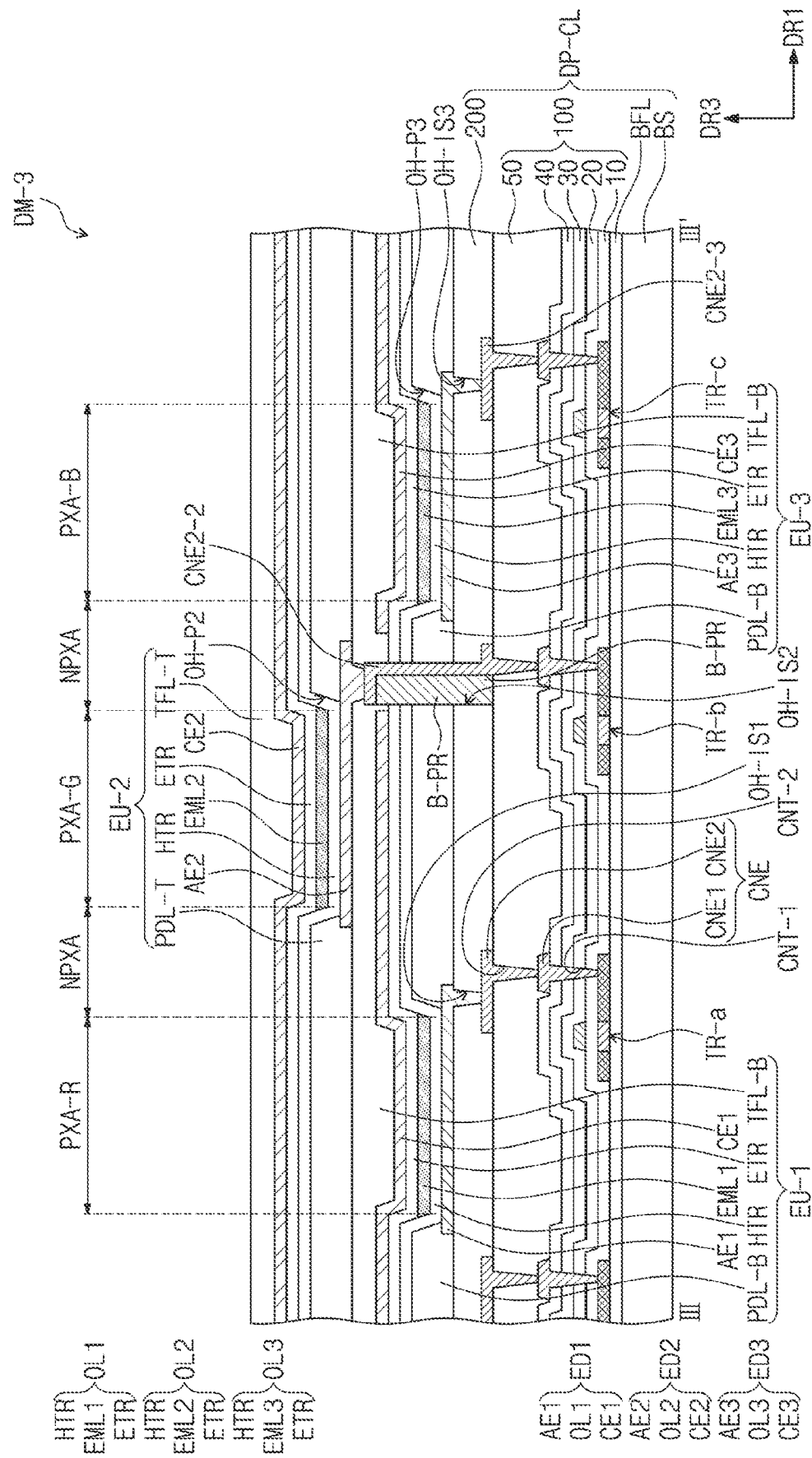
FIG. 11 is a cross-sectional view of a display module according to an embodiment.

In one example, FIG. 8 illustrates electrode edge portions CEG1, CEG2, and CEG3 of the upper electrodes CE1, CE2, and CE3 (as shown in FIG. 4). Areas of the first upper electrode CE1 (as shown in FIG. 4), the second upper electrode CE2 (as shown in FIG. 4), and the third upper electrode CE3 (as shown in FIG. 4) may sequentially increase. The second electrode edge portion CEG2 may be disposed outward of the first electrode edge portion CEG1 on a plane. The third electrode edge portion CEG3 may be disposed outward of the second electrode edge portion CEG2 on a plane. Hereinafter, a display module according to an embodiment will be described with reference to FIGS. 9, 10, and 11 and the like. In the description of FIGS. 9, 10, and 11, the same contents as those described with reference to FIGS. 1, 2, 3, 4, 5, 6, 7, and 8 will not be described again, and differences will be mainly described.

FIG. 9 is a cross-sectional view of a display module according to an embodiment. Unlike the display module shown in FIGS. 1, 2, 3, 4, 5, 6, 7, and 8, in the display module shown in FIG. 9, a first metal oxide film is disposed between the lower protrusion and the lower insulating layer, and a second metal oxide film is disposed between the upper protrusion and the lower insulating layer.

Referring to FIG. 9, in a display module DM-1 of one embodiment, a first metal oxide layer MOL1 may be disposed between the lower protrusion BPR and the lower insulating layer 100, and a second metal oxide layer MOL2 may be disposed between the upper protrusion UPR and the lower insulating layer 100. The first metal oxide layer MOL1 and the second metal oxide layer MOL2 may be disposed to be spaced apart from each other on a plane. The first metal oxide layer MOL1 and the second metal oxide layer MOL2 may independently contain at least one of indium-zinc-oxide (IZO), indium-tin-oxide (ITO), zinc-oxide (ZnO), indium-gallium-zinc-oxide (IGZO), and aluminum-zinc-oxide (AZO).

FIG. 10 is a cross-sectional view of a display module according to an embodiment. Unlike the display module shown in FIGS. 1, 2, 3, 4, 5, 6, 7, and 8, in the display module shown in FIG. 10, the lower protrusion is disposed on top of the first pixel defining layer, and the upper protrusion is disposed on top of the second pixel defining layer.

Referring to FIG. 10, in a display module DM-2 of one embodiment, a lower protrusion BPR-1 may be disposed on top of the first pixel defining layer PDL1, and an upper protrusion UPR-1 may be disposed on top of the second pixel defining layer PDL2. The first pixel defining layer PDL1 may be disposed between the circuit layer DP-CL and the lower protrusion BPR-1. The second pixel defining layer PDL2 may be disposed between the circuit layer DP-CL and the upper protrusion UPR-1.

Portions of the upper insulating layer 200 overlapping each of the lower protrusion BPR-1 and the upper protrusion UPR-1 may be flat surfaces. Portions of the first pixel defining layer PDL1 overlapping each of the lower protrusion BPR-1 and the upper protrusion UPR-1 may be flat surfaces. A portion of the second pixel defining layer PDL2 overlapping the upper protrusion UPR-1 may be a flat surface.

The second upper contact electrode CNE2-2 may pass through a second insulating contact hole OH-IL2 defined in the lower insulating layer 100 and extend to a top surface of the lower protrusion BPR-1. The second upper contact electrode CNE2-2 may be electrically connected to the second lower electrode AE2 on the top surface of the lower protrusion BPR-1. As the second upper contact electrode CNE2-2 is electrically connected to the second lower electrode AE2 on the top surface of the lower protrusion BPR-1, the etching process of the first encapsulation layer TFL1 may be simplified.

The third upper contact electrode CNE2-3 may pass through a third insulating contact hole OH-IL3 defined in the lower insulating layer 100 and extend to a top surface of the upper protrusion UPR-1. As the third upper contact electrode CNE2-3 is electrically connected to the third lower electrode AE3 on the top surface of the lower protrusion BPR-1, the etching process of the second encapsulation layer TFL2 may be simplified.

FIG. 11 is a cross-sectional view of a display module according to an embodiment. Unlike the display module shown in FIGS. 1, 2, 3, 4, 5, 6, 7, and 8, in the display module shown in FIG. 11, the first light emitting unit and the third light emitting unit are disposed on the same layer, and the second light emitting unit is arranged on top of the first light emitting unit and the third light emitting unit.

Referring to FIG. 11, in a display module DM-3 of one embodiment, the first light emitting unit EU-1 and the third light emitting unit EU-3 may be spaced apart from each other on a plane. The third pixel opening OH-P3 may be defined in the first pixel defining layer PDL-B to be spaced apart from the first pixel opening OH-P1. The third light emitting unit EU-3 may be disposed on top of the circuit layer DP-CL in the third pixel opening OH-P3.

The third light emitting unit EU-3 may include the third lower electrode AE3, a third light emitting layer EML3, the third upper electrode CE3, and the second encapsulation layer TFL-B. The third lower electrode AE3 may be disposed on the top of the circuit layer DP-CL and exposed by the first pixel opening OH-P1. The third light emitting layer EML3 may be disposed on the top of the third lower electrode AE3 exposed by the first pixel opening OH-P1. The third upper electrode CE3 may be disposed on the top of the third light emitting layer EML. The second encapsulation layer TFL-B may be disposed on the top of the third upper electrode CE3. That is, the second encapsulation layer TFL-B may be disposed on the top of the second and third upper electrodes CE2 and CE3.

In one embodiment, the lower protrusion BPR may be disposed on the same layer as the first light emitting unit EU-1 and the third light emitting unit EU-3. The lower protrusion BPR and the first and third light emitting units EU-1 and EU-3 may be disposed on the lower insulating layer 100. However, this is only an example, and the embodiment is not limited thereto. The lower protrusion BPR may be disposed on a different layer from the first and third light emitting units EU-1 and EU-3.

The lower protrusion BPR may be disposed between the first and third light emitting units EU-1 and EU-3 on a plane. The lower protrusion BPR may be disposed on the same layer as the first and third light emitting units EU-3 and disposed between the first and third light emitting units EU-1 and EU-3 on the plane.

The second upper contact electrode CNE2-2 may be disposed on the top of the lower insulating layer 100 while following the shape of the lower protrusion BPR to the top surface UA-BPR (as shown in FIG. 7A) of the lower protrusion BPR. The second upper contact electrode CNE2-2 may be electrically connected to the second lower electrode AE2 in the portion thereof overlapping the lower protrusion BPR. As the second upper contact electrode CNE2-2 is electrically connected to the second lower electrode AE2 on the top surface of the lower protrusion BPR, an etching thickness of the first encapsulation layer TFL1 for electrically connecting the second lower electrode AE2 and the second upper contact electrode CNE2-2 to each other may be reduced. Accordingly, the etching process of the first encapsulation layer TFL1 may be simplified.

The display device of one embodiment may include the first light emitting unit including the base layer, the circuit layer disposed on top of the base layer, and the first encapsulation layer disposed on the top of the circuit layer, the second light emitting unit disposed on the top of the first light emitting unit and including the second encapsulation layer, and the lower protrusion disposed between the circuit layer and the second lower electrode, thereby reducing a width of the first encapsulation layer in a thickness direction of the contact hole. As a result, the etching process of the first encapsulation layer may be simplified.

The display device according to one embodiment includes a protrusion protruding from the circuit layer toward the light emitting unit to reduce an etching thickness of the encapsulation layer for connecting the circuit layer and the light emitting unit to each other, thereby simplifying an etching process of the encapsulation layer.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
   a base layer;
   a circuit layer including a plurality of transistors spaced apart from each other and disposed on a top of the base layer, a plurality of insulating layers disposed on a top of the base layer, and a plurality of contact electrodes electrically connected to the plurality of transistors, respectively;
   a first light emitting unit including a first lower electrode disposed on a top of the circuit layer, a first pixel defining layer disposed on a top of the first lower electrode, wherein a first pixel opening for exposing the first lower electrode is defined in the first pixel defining layer, a first light emitting layer disposed on a top of the first lower electrode, a first upper electrode disposed on a top of the first light emitting layer, and a first encapsulation layer disposed on a top of the first upper electrode;
   a second light emitting unit including a second lower electrode disposed on a top of the first light emitting unit, a second pixel defining layer disposed on a top of the second lower electrode, wherein a second pixel opening for exposing the second lower electrode is defined in the second pixel defining layer, a second light emitting layer disposed on a top of the second lower electrode, a second upper electrode disposed on a top of the second light emitting layer, and a second encapsulation layer disposed on a top of the second upper electrode; and
   a lower protrusion disposed between at least one of the transistors and the second lower electrode,
   wherein at least one of the contact electrodes is disposed to extend to a top surface of the lower protrusion in the circuit layer while following a shape of the lower protrusion.

2. The display device of claim 1, wherein the transistors include a first transistor electrically connected to the first light emitting unit, and a second transistor spaced apart from the first transistor and electrically connected to the second light emitting unit,
   wherein the contact electrodes further include:
      a first upper contact electrode for electrically connecting the first transistor to the first light emitting unit; and
      a second upper contact electrode for electrically connecting the second transistor to the second light emitting unit.

3. The display device of claim 2, wherein the second upper contact electrode extends to the top surface of the lower protrusion in the circuit layer while following the shape of the lower protrusion, and
   wherein the second upper contact electrode is electrically connected to the second lower electrode in a portion, which overlaps the lower protrusion.

4. The display device of claim 1, wherein the first encapsulation layer includes a first inorganic layer, a first organic layer, and a second inorganic layer, which are sequentially stacked in a thickness direction, and
   wherein a length extending from a bottom surface of the first inorganic layer to the top surface of the lower protrusion is greater than a length extending from the bottom surface of the first inorganic layer to a top surface of the first organic layer.

5. The display device of claim 4, wherein the first encapsulation layer is divided into a first portion where the second inorganic layer is directly disposed on the first inorganic layer, and a second portion where the first organic layer is disposed between the first inorganic layer and the second inorganic layer, and
   wherein the first portion is more closely disposed to the lower protrusion than the second portion.

6. The display device of claim 1, wherein the lower protrusion contains a polyimide-based resin, an acrylic-based resin, or a novolak-type phenol-based resin.

7. The display device of claim 1, wherein the lower protrusion contains at least one of silicon oxide and silicon nitride.

8. The display device of claim 1, wherein the insulating layers include:
a lower insulating layer disposed adjacent the transistors; and
an upper insulating layer disposed on a top of the lower insulating layer, wherein an insulating contact hole for exposing the lower insulating layer is defined in the upper insulating layer, and
wherein the lower protrusion is disposed between the lower insulating layer and the second lower electrode in the insulating contact hole.

9. The display device of claim 8, wherein the lower protrusion is disposed directly on the top of the lower insulating layer in the insulating contact hole.

10. The display device of claim 1, wherein the lower protrusion is disposed on a top of the first pixel defining layer.

11. The display device of claim 1, wherein an area on a plane of the first encapsulation layer is smaller than an area on a plane of the second encapsulation layer.

12. The display device of claim 1, wherein a third pixel opening is defined in the first pixel defining layer and is spaced apart from the first pixel opening,
wherein the display device further includes a third light emitting unit disposed on a top of the circuit layer in the third pixel opening, and
wherein the third light emitting unit includes a third lower electrode disposed on a top of the circuit layer and exposed by the third pixel opening, a third light emitting layer disposed on a top of the third lower electrode, a third upper electrode disposed on atop of the third light emitting layer, and the second encapsulation layer disposed on a top of the third upper electrode.

13. The display device of claim 12, wherein the lower protrusion is disposed between the first light emitting unit and the third light emitting unit on a plane.

14. The display device of claim 1, further comprising:
a third light emitting unit disposed on a top of the second light emitting unit, wherein the third light emitting unit includes a third lower electrode, a third pixel defining layer disposed on a top of the third lower electrode, wherein a third pixel opening for exposing the third lower electrode is defined in the third pixel defining layer, a third light emitting layer disposed on a top of the third lower electrode, a third upper electrode disposed on atop of the third light emitting layer, and a third encapsulation layer disposed on a top of the third upper electrode.

15. The display device of claim 14, further comprising:
an upper protrusion disposed on a plane to be spaced apart from the lower protrusion, and disposed between at least one of the transistors and the third lower electrode.

16. The display device of claim 15, wherein the second encapsulation layer includes a third inorganic layer, a second organic layer, and a fourth inorganic layer, which are sequentially stacked in a thickness direction, and
wherein a length extending from a bottom surface of the third inorganic layer to a top surface of the upper protrusion is greater than a length extending from the bottom surface of the third inorganic layer to a top surface of the second organic layer.

17. The display device of claim 15, wherein the transistors include a first transistor electrically connected to the first light emitting unit, a second transistor spaced apart from the first transistor and electrically connected to the second light emitting unit, and a third transistor spaced apart from the second transistor and electrically connected to the third light emitting unit, and
wherein the circuit layer further includes:
a first upper contact electrode for electrically connecting the first transistor to the first light emitting unit;
a second upper contact electrode for electrically connecting the second transistor to the second light emitting unit; and
a third upper contact electrode for electrically connecting the third transistor to the third light emitting unit.

18. The display device of claim 17, wherein the third upper contact electrode is disposed from the third transistor to a top surface of the upper protrusion while following a shape of the upper protrusion, and
wherein the third upper contact electrode is electrically connected to the third lower electrode in a portion where the third upper contact electrode overlaps the upper protrusion.

19. The display device of claim 1, further comprising:
a metal oxide film disposed between the at least one transistor and the lower protrusion.

20. The display device of claim 19, wherein the metal oxide film contains at least one of indium-zinc-oxide (IZO), indium-tin-oxide (ITO), zinc-oxide (ZnO), indium-gallium-zinc-oxide (IGZO), and aluminum-zinc-oxide (AZO).

* * * * *

UNITED STATES PATENT AND TRADEMARK OFFICE
CERTIFICATE OF CORRECTION

Page 1 of 2

PATENT NO. : 12,433,105 B2
APPLICATION NO. : 17/734380
DATED : September 30, 2025
INVENTOR(S) : Yeonhwa Lee et al.

It is certified that error appears in the above-identified patent and that said Letters Patent is hereby corrected as shown below:

In the Specification

Column 1, Lines 44, 45 to 46, cancel the text "a top of".

Column 1, Lines 49, 50, 53, 54, 56, 57, 59, 62, 63, 65, cancel the text "top of".

Column 2, Line 41, cancel the text "top of".

Column 2, Line 47 to 48, cancel the text "the top of".

Column 2, Lines 49, 57, 59, 61, 62, 63 to 64, cancel the text "a top of".

Column 3, Lines 2, 4 to 5, 8, 9, 10, cancel the text "a top of".

Column 23, Line 67 and Column 24, Lines 1 to 2, 6, 7, 10, 12, 13, 16, 17, 21, 23, 24, cancel the text "a top of".

Column 25, Line 11, cancel the text "a top of".

Column 25, Line 19, cancel the text "the top of".

Column 25, Line 22, cancel the text "a top of".

Column 25, Lines 31, 34, 36, 39, cancel the text "a top of".

Column 25, Line 37, cancel the text "atop of".

Signed and Sealed this
Sixth Day of January, 2026

John A. Squires
*Director of the United States Patent and Trademark Office*

Column 25, Lines 44, 47 and Column 26, Lines 1, 4, cancel the text "a top of".

Column 25, Line 3, cancel the text "atop of".